United States Patent
Nishikawa et al.

(10) Patent No.: US 6,899,965 B2
(45) Date of Patent: May 31, 2005

(54) DIELECTRIC FILM AND METHOD FOR FORMING THE SAME

(75) Inventors: Takashi Nishikawa, Osaka (JP); Kenji Iijima, Kyoto (JP)

(73) Assignee: Matsushita Electric Industrial Co., Ltd., Osaka (JP)

(*) Notice: Subject to any disclaimer, the term of this patent is extended or adjusted under 35 U.S.C. 154(b) by 7 days.

(21) Appl. No.: 10/107,334

(22) Filed: Mar. 28, 2002

(65) Prior Publication Data

US 2002/0096105 A1 Jul. 25, 2002

Related U.S. Application Data

(62) Division of application No. 09/527,475, filed on Mar. 17, 2000, now Pat. No. 6,569,240.

(30) Foreign Application Priority Data

| Mar. 17, 1999 | (JP) | 11-072410 |
| Jun. 17, 1999 | (JP) | 11-171352 |
| Sep. 1, 1999 | (JP) | 11-246933 |

(51) Int. Cl.[7] ............................................. B32B 9/00
(52) U.S. Cl. .............................. 428/701; 428/699
(58) Field of Search .................. 428/689, 697, 428/699, 701, 702; 257/295, 499; 438/778, 779, 785, 758

(56) References Cited

U.S. PATENT DOCUMENTS

| 4,479,297 A | | 10/1984 | Mizutani et al. |
| 5,514,484 A | * | 5/1996 | Nashimoto ............. 428/700 |
| 6,077,344 A | | 6/2000 | Shoup et al. |
| 6,214,712 B1 | * | 4/2001 | Norton ................. 438/591 |
| 6,265,353 B1 | * | 7/2001 | Kinder et al. .......... 505/238 |
| 6,278,138 B1 | | 8/2001 | Suzuki |
| 6,469,334 B2 | * | 10/2002 | Arita et al. ............ 257/295 |

FOREIGN PATENT DOCUMENTS

| JP | 57-211267 | | 12/1982 |
| JP | 8-162614 | | 6/1994 |
| JP | 08-162614 | * | 6/1996 |
| JP | 9-172097 | | 6/1997 |
| JP | 10-106054 | | 4/1998 |
| JP | 10-199999 | | 7/1998 |
| JP | 10-231196 | | 9/1998 |
| JP | 2000-344599 | | 12/2000 |

OTHER PUBLICATIONS

I. Sakai et al., "Preparation and Characterization of PZT Thin Films on $CeO_2$ (111)/Si(111) Structures", Jpn. J. Appl. Phys., vol. 35, Part 1, No. 9B, pp. 4987–4990, Sep. 1996.

T. Inoue et al., "Intermediate Amorphous Layer Formation Mechanism at the Interface of Epitaxial $CeO_2$ Layers and Si Substrates", Jpn. J. Appl. Phys., vol. 32, Part 1, No. 4, pp. 1765–1767, Apr. 1993.

(Continued)

*Primary Examiner*—Jennifer McNeil
*Assistant Examiner*—A B Sperty
(74) *Attorney, Agent, or Firm*—McDermott, Will & Emery LLP

(57) ABSTRACT

After an underlying layer, made of a single crystal metal material, has been formed on a semiconductor layer, part or all of the underlying layer is changed into a metal oxide layer by supplying oxygen thereto from above the underlying layer. Then, a ferroelectric or high-dielectric-constant film is further formed on the metal oxide layer. Since the film made of a metal material is formed on the semiconductor layer, a silicon dioxide film or the like is not formed easily. Thus, a dielectric film, which includes an underlying layer with a high dielectric constant and has a large capacitance per unit area, can be obtained. Various defects such as interface states in the semiconductor layer can also be reduced advantageously if these process steps are performed after a thermal oxide film has been formed on the semiconductor layer.

3 Claims, 20 Drawing Sheets

OTHER PUBLICATIONS

S. Yaegashi et al., "Epitaxial Growth of $CeO_2$ Films on Si(111) by Sputtering", Jpn. J. Appl. Phys., vol. 33, Part 1, No. 1A, pp. 270–274, Jan. 1994.

H. Koinuma et al., "Ceramic layer epitaxy by pulsed laser deposition inan ultrahigh vacuum system", Appl. Phys. Lett., 58(18), pp. 2027–2029, May 6, 1991.

T. Inoue et al., "Texture Structure Analysis and Crystalline Quality Improvement of $CeO_2$ (110) Layers Grown on Si(100) Substrates", Jpn. J. Appl. Phys., vol. 31, Part 2, No. 12B, pp. L1736–L1739, Dec. 15, 1992.

M. Yoshimoto et al., "In Situ RHEED Observation of $CeO_2$ Film Growth on Si by Laser Ablation Deposition in Ultrahigh–Vacuum", Japanese Journal of Applied Physics, vol. 29, No. 7, pp. L1199–L1202, Jul. 1990.

"Seiji Yaegashi et al", "Epitaxial Growth of $CeO_2$ Films on Si(111) by Sputtering", Japanese Journal of Applied Physics, vol. 33, Part 1, No. 1A, pp. 270–274, Jan. , 1994, First Page Only.

Dading Huang et al., "High quality $CeO_2$ film grown on Si(111) substrate by using low energy dual ion beam deposition technology," Appl. Phys. Lett., vol. 67, No. 25, Dec. 18, 1995, pp 3724–3725.

W.J. Meng, et al., "Epitaxial growth of aluminum nitride on Si(111) by reactive sputtering," Appl. Phys. Lett. vol. 59, No. 17, Oct. 21, 1991, pp. 2097–2099.

* cited by examiner (PRIOR ART) Fig. 21c (PRIOR ART)

DIELECTRIC FILM AND METHOD FOR FORMING THE SAME

This application is a divisional of U.S. Ser. No. 09/527,475 filed on Mar. 17, 2000, now U.S. Pat. No. 6,569,240.

BACKGROUND OF THE INVENTION

The present invention relates to a method and apparatus for forming an excellently crystalline dielectric film with a high dielectric constant, like a $CeO_2$ film, or ferroelectric film out of metal Ce and oxygen on an Si substrate.

In recent years, the number of C-MOS devices that can be integrated together on a single Si substrate has increased significantly because those devices have been tremendously downsized. To catch up with this trend, reduction in thickness of a gate insulating film, which is part of a MOSFET, is also in high demand. A thinner gate insulating film is needed because of the following reasons.

First of all, although the operating voltage has been reduced day after day to conserve power as much as possible, the quantity of charge required for the operation of a device remains almost the same and has not been reduced so much. Since the relationship of Q=CV (where Q is the quantity of charge, C is static electricity and V is voltage) should be met, the static electricity C that can be retained in a gate insulating film must be increased to reduce the voltage V with the quantity of charge Q kept substantially constant. The static electricity C is given by $C=(\in r \cdot S)/d$, where $\in r$ is relative dielectric constant, S is the area of a capacitor and d is a space between electrodes. Accordingly, the static electricity C can be increased if the thickness d of a gate insulating film, which is currently made of $SiO_2$ in many cases, is reduced. For that purpose, the gate insulating film has been thinned to a thickness between 10 and 15 nm or less than 10 nm.

However, if a gate insulating film is thinned that much, then various inconveniences might be concerned about lately; the breakdown strength of the gate insulating film might decrease or the leakage current might increase.

In view of these potential disadvantages, alternative gate insulating film materials, which have a relative dielectric constant $\in r$ higher than that of $SiO_2$ and yet exhibit pretty good electrical properties comparable to those of $SiO_2$, have been searched for. That is to say, if the relative dielectric constant $\in r$ is higher, then the static electricity C can be kept high even when the thickness d is increased to a certain degree. Accordingly, the required charge quantity Q is attainable even with a reduced operating voltage. Taking these points into account, methods for forming, on an Si substrate, an insulating film made of a novel insulating material with high dielectric constant and breakdown strength and low interface level and leakage current have been researched and developed to attain characteristics comparable to those of the $SiO_2$ gate insulating film currently used.

Efforts have also been made to form an insulating film of a non-$SiO_2$ insulator material on an Si substrate by a different type of demand. For example, an example disclosed in Japan Journal of Applied Physics 35, 4987, (1996) (which will be herein called a "first document" for convenience sake) reported research for implementing a transistor with memory function by providing a thin film with ferroelectricity for the gate of a field effect transistor. According to the technique disclosed in this document, a thin film of $PbZr_{1-x}Ti_xO3$ (PZT) with ferroelectricity, i.e., a PZT film, is formed as an exemplary thin film of that type. However, since it is difficult to form the PZT film directly on an Si substrate, an insulating film of $CeO_2$, for example, is interposed as a buffer layer between the PZT film and the Si substrate.

Methods for forming a novel insulator film on an Si substrate to attain those characteristics, including high dielectric constant and breakdown strength and low interface level and leakage current, as in the gate insulating film mentioned above, have also been researched such that a ferroelectric or other dielectric film (e.g., superconductor film) can be formed on the Si substrate.

According to any of these suggested techniques, a $CeO_2$ film is one of very attractive insulator materials for a buffer layer. This is because the lattice constant of $CeO_2$ is closer to that of Si than any other known material and a lattice mismatch between $CeO_2$ and Si is only −0.37% (i.e., $a_{CeO2}$=5.411 Å and $a_{Si}$=5.431 Å). In addition, since the crystal structure of $CeO_2$ is like that of fluorite, $CeO_2$ can form a continuous crystal lattice with the Si substrate having a diamond structure. The coordination number for all the atoms is four in Si, whereas the coordination number for oxygen atoms is four and that for Ce atoms is eight in $CeO_2$. However, since both Si and $CeO_2$ crystals belong to a cubic system, which is represented as a face-centered cubic lattice as a matter of principle, Si and $CeO_2$ crystals can be stacked one upon the other by epitaxial growth (because mole ratio of oxygen to Ce is 2:1). Thus, it is possible to form a thin film with excellent crystallinity on the Si substrate, and it is easier to stack a ferroelectric or superconductor film with high crystallinity thereon. Furthermore, since the relative dielectric constant of $CeO_2$ is as high as around 26, it is very likely that $CeO_2$ will be used as a novel gate insulating film material in place of $SiO_2$.

Various techniques of forming $CeO_2$ on an Si substrate have been proposed in numerous other documents as well as the first document. Following is typical examples of them.

According to an example disclosed in Japan Journal of Applied Physics, 1765, (1993) (which will be herein called a "second document" for convenience sake), $CeO_2$ is evaporated from a pellet-like $CeO_2$ sintered compact by irradiating the compact with an electron beam (EB) in a molecular beam epitaxy (MBE) system including an EB evaporation unit, thereby forming an excellently crystalline $CeO_2$ thin film on an Si substrate. In this case, decline in crystallinity of the $CeO_2$ thin film due to the oxygen deficiency is prevented by supplying oxygen gas while $CeO_2$ is being evaporated. In the first document, the $CeO_2$ film is also formed by the same method.

An example disclosed in Japan Journal of Applied Physics 270, 1994 (which will be herein called a "third document" for convenience sake) uses a thin film forming technique different from that of the first and second documents. In the third document, a reactive sputterer including a target of metal Ce is used and Ce atoms are sputtered out of the target with oxygen gas supplied thereto and reacted with oxygen on the Si substrate, thereby forming an excellently crystalline $CeO_2$ thin film on the Si substrate.

An example disclosed in Applied Physics Letters 2027, (1991) (which will be herein called a "fourth document" for convenience sake) forms a $CeO_2$ film by a different technique from any of the techniques mentioned above. In the fourth document, an MBE system, into which ArF excimer laser radiation can be introduced externally, is used, a pellet-like $CeO_2$ sintered compact placed inside is irradiated with the laser radiation to evaporate $CeO_2$ therefrom and oxygen gas is introduced at the same time. In this manner, an excellently crystalline $CeO_2$ thin film is formed on the Si substrate.

These methods of forming a crystalline CeO$_2$ thin film as disclosed in the documents cited above, however, have the following shortcomings.

It should be noted that a family of crystallographic planes including (100), (010), (001) and so forth will be collectively referred to as a (001) plane in the following description, although such a family of planes should be labeled {001}. The same statement will be applicable to a (011) or (111) plane. Similarly, (001), (011) or (111) substrate or film will mean a substrate or film with a (001), (011) or (111) plane as its principal surface.

First, in accordance with the example disclosed in the first and second documents, oxygen and Ce are supplied at the same time by evaporating CeO$_2$ from a pellet-like CeO$_2$ sintered compact being heated. That is to say, since Ce and oxygen reach the surface of the Si substrate at a time, SiO$_2$, as well as CeO$_2$, is formed thereon. Should SiO$_2$ be formed, the sharpness of crystallinity decreases at the interfacial structure and the planarity of the surface also deteriorates since SiO$_2$ generally has an amorphous structure. Also, if the structure with the SiO$_2$ film is operated as a device, a voltage applied will be concentrated on the SiO$_2$ film with the lower dielectric constant in spite of the presence of the CeO$_2$ film with the higher dielectric constant. As a result, it is difficult to store charge to a quantity large enough to ensure the intended function of a gate insulating film. In addition, even when such a CeO$_2$ film mingled with SiO$_2$ is used as a buffer layer for a ferroelectric or superconductor film, it is also difficult to apply a required voltage to the ferroelectric or superconductor layer.

Following the example disclosed in the second document, a CeO$_2$(111) film can be formed on an Si(111) substrate. But only a CeO$_2$(011) film, not a CeO$_2$(001) film, can be formed on an Si(001) substrate. That is to say, even though the lattice constants of CeO$_2$ and Si are close to each other, the plane orientations thereof are different from each other. Thus, the effects of suppressing lattice strain and preventing the generation of defects cannot be expected at all. Furthermore, although a CeO$_2$(011) film is formed, the film actually has a polycrystalline structure, in which two types of crystals coexist on the principal surface of the Si substrate so as to be symmetrical around an axis and form an angle of 90 degrees between them. Accordingly, it is difficult to obtain a smooth and uniform single crystal thin film.

Japan Journal of Applied Physics 31, L1736, (1992) (which will be herein called a "fifth document" for convenience sake) explains the reason of this phenomenon. Specifically, it is believed that higher stability is attained where the (001) plane of Si crystals is continuous with the (011) plane of CeO$_2$ crystals rather than where the (001) planes of these two types of crystals are continuous with each other. This is probably because dangling bonds appearing on the 2×1 streaks on the (001) plane of Si crystals that are formed in high vacuum are located close to oxygen atoms within the (011) plane of CeO$_2$ crystals.

The fourth document shows that a CeO$_2$(111) film with excellent crystallinity can be formed on an Si(111) substrate. In accordance with this example, an oscillation of diffraction pattern intensity (RHEED oscillation) is observed by a reflection high-energy electron diffraction (RHEED) analysis during the crystal growth. The generation of the RHEED oscillation indicates that the crystals are growing two-dimensionally, or layer by layer, while keeping high smoothness at the surface. Even when the cross section thereof is observed by TEM, the existence of large defects is hardly observable. The formation of SiO$_2$ is not found in the interface between Si and CeO$_2$, either. However, this document does not report on successfully forming a (001) plane of CeO$_2$ crystals on a (001) plane of Si crystals, either.

Japan Journal of Applied Physics 29, L1199, (1990) (which will be herein referred to as a "sixth document" for convenience sake) makes a disclosure about this. Specifically, since Ce and oxygen are also supplied at a time even by using such a system, a CeO$_2$(011) film is formed unintentionally on an Si(001) substrate.

Even in the example disclosed in the third document, a (111) plane of CeO$_2$ with excellent crystallinity is formed on a (111) plane of an Si substrate as in the second and fourth documents. In accordance with the method disclosed in the third document, metal Ce is used as a source material. Thus, the method succeeds in supplying only Ce onto the interface of the Si substrate and suppressing the formation of SiO$_2$. However, a layer consisting of metal Ce alone, which is needed in obtaining the excellently crystalline CeO$_2$ film, is as thick as 5 nm. Accordingly, if the film is used as a gate insulating film for a transistor, then the operation of the transistor device is seriously affected by the existence of the thick metal layer. In addition, the third document does not report on successfully forming a CeO$_2$(001) film on an Si(001) substrate, either. The reason thereof cannot be found in the document. But we think it would be difficult to form CeO$_2$ crystals with the same plane orientation by relaying information about the crystal structure of the Si substrate if the metal Ce layer with the thickness of about 5 nm exists between them.

SUMMARY OF THE INVENTION

An object of the invention to work out a technique of forming an excellently crystalline metal oxide layer, such as a CeO$_2$ film, on an Si substrate, which has been impossible according to any of the documents cited, and thereby develop a technique of forming a ferroelectric film with good orientations on the crystalline metal oxide layer.

First, it will be described what analyses we carried out to arrive at the inventive idea on the novel method for forming a metal oxide layer like a CeO$_2$ film.

The fifth document discloses the reasons why only a CeO$_2$(011) film, not a CeO$_2$(001) film, can be formed on an Si(001) substrate. Those reasons will be described in detail below.

FIG. 19 illustrates how CeO$_2$ crystals grow epitaxially on a (001) plane of an Si substrate and corresponds to FIG. 2 of the fifth document. In FIG. 19, the larger open circles represent Ce atoms 1, the medium dotted circles represent Si atoms 2 and the smaller open circles represent oxygen atoms 3. On the surface of the Si substrate, a (001) plane of Si crystals with a unit cell 4 has appeared. One side of the unit cell 4 is parallel to the [100] direction, while another side of the unit cell 4 is parallel to the [010] direction. In other words, supposing the paper of FIG. 19 is a plane parallel to the (001) crystallographic plane of Si crystals, the x- and y-axes of Si crystals exist within the paper and the z-axis of Si crystals is the direction coming out of the paper. On the other hand, two types of CeO$_2$ crystals, which are represented by two unit cells 5 and 6 shown in FIG. 19, are created at an equal percentage to match the (001) plane of Si crystals. One side of each of these unit cells 5 and 6 is parallel to the [100] direction (i.e., the x-axis direction), while another side thereof is parallel to the [011] direction (i.e., the direction tilted from the y-axis by 45 degrees). The x-axes of the unit cells 5 and 6 cross each other at right angles, and the [011] direction of the unit cell 5 and the [011]

direction of the unit cell 6 also cross each other at right angles. In other words, the unit cell 6 is obtained by rotating the unit cell 5 by 90 degrees around an axis in the direction coming out of the paper of FIG. 19. The y- and z-axes of each of the unit cells 5 and 6 are tilted from the paper of FIG. 19 by 45 degrees.

As shown in FIG. 19, the O atoms 3 are located over and between columns of Si atoms 2 in the Si crystals in the (011) plane of $CeO_2$ crystals. When viewed one-dimensionally along the [100] direction of the lattice structure of Si crystals, i.e., when viewed in the direction coming out of the paper, these O atoms 3 are located very close to the dangling bonds appearing on the 2×1 restructured structure on the uppermost surface of the Si substrate. Accordingly, Ce and O (oxygen), which are supplied at a time onto the Si substrate, are likely to form the (011) plane of $CeO_2$ crystals rather than a (001) plane of the $CeO_2$ crystals. And when the (011) plane of $CeO_2$ crystals is formed on the Si substrate, two types of crystal structures, i.e., the unit cells 5 and 6, appear at an equal percentage to be symmetrical to each other around an axis as shown in FIG. 19. Thus, when $CeO_2$ crystals are grown epitaxially on the Si substrate, two types of crystals with two different orientations coexist and form respective domains. As a result, a $CeO_2$ film, which is regarded as polycrystalline as a whole, is formed.

FIG. 20 is a microgram obtained by observing the coexistence of two domains in a $CeO_2$ film by high-resolution transmission electron microscopy (HRTM) as disclosed in the fifth document. As shown in FIG. 20, a domain CrA with an x-axis in the [100] direction parallel to the horizontal direction of FIG. 20 and a domain CrB with an x-axis in the [100] direction parallel to the vertical direction of FIG. 20 coexist. The sizes of these domains CrA and CrB are in the range from 10 to 50 nm.

FIG. 18 is a schematic cross-sectional view illustrating a state where two types of $CeO_2$ crystal domains exist in a $CeO_2(011)$ film 9 formed on an Si(100) substrate 8.

Next, a process through which $CeO_2(111)$ crystals are formed on an Si(111) substrate will be considered. The structures of Si and $CeO_2$ crystals in such a case are disclosed in the sixth document. FIGS. 21(a) through 21(c) correspond to FIG. 4 of the sixth document and illustrate orientations of $CeO_2$ crystals, which grow epitaxially on (001), (111) and (110) planes of an Si substrate. FIG. 21(a) illustrates that two types of $CeO_2$ crystal domains, whose film plane is a (011) plane, are formed on the (001) plane of the Si substrate as in the fifth document. On the other hand, FIG. 21(b) illustrates that $CeO_2(011)$ and (111) films can be formed on an Si(011) substrate.

As can be seen from FIG. 21(b), the $CeO_2(111)$ film is likely to grow on the Si(111) substrate and there is little lattice mismatch therebetween. In this case, the $CeO_2$ crystals have such a structure as including a layer consisting of Ce alone and a layer consisting of oxygen alone that are alternately stacked one upon the other vertically to the surface of the substrate, strictly speaking. However, since these two layers are located very close to each other, two types of atoms can be regarded as substantially existing in a common plane. Thus, the energy required for eliminating one of these two types of atoms, i.e., Ce and O atoms, and thereby forming a layer consisting of only one remaining type of atoms is not high for any layer of either type of atoms. That is to say, even if Ce and O atoms are supplied at a time onto the Si substrate, the $CeO_2(111)$ film can still be formed. And we can say that no other $CeO_2$ film with a different plane orientation will be formed.

However, since the (111) plane is the densest plane of crystals making up a diamond structure, the greatest number of Si dangling bonds exist on the (111) plane. Accordingly, if O and Ce atoms are supplied at a time onto that surface of the Si substrate, then not only $CeO_2$ crystals but also an $SiO_2$ layer will be formed on the surface of the Si substrate. That is to say, crystallinity might decline and dielectric constant might decrease.

In the first, third, fourth and sixth documents, the crystallinity of a $CeO_2$ thin film obtained is analyzed with X-rays. Among these XRD analysis curves, that of the fourth document represents a diffraction peak with the smallest full width of half maximum (FWHM), which is still as large as 3500 arc sec., though. The FWHMs shown in the other documents are much greater than that. This is a very bad value considering that the lattice mismatch ratio between Si and $CeO_2$ crystals is only −0.37%. For example, the FWHM of ZnSe, which has a lattice mismatch ratio of 0.26% with respect to GaAs (where $a_{GaAs}$=5.6533 and $a_{ZnSe}$=5.668), is 300 arc sec. or less (as for a 2 θ-axis-fixed, ω-axis-scanning rocking curve). The FWHM values shown in the respective documents are obtained by performing scanning on both axes of ω−2 θ(θ−2 θ). Thus, supposing half of each of these values is equivalent to the value obtained by ω-axis scanning, the largest FWHM is still about 6 times as large as the FWHM of ZnSe. That is to say, the $CeO_2$ film according to these documents seems to be smooth and less defective at a local level observable by TEM or the like. In the $CeO_2$ film, however, significant lattice disorder and irregularity like defects are found within a range corresponding to a spot diameter of a beam of X-rays. Accordingly, compared to crystals used for a compound semiconductor, the crystallinity thereof seems to be much inferior. As can be seen, such poor crystallinity of the $CeO_2$ film seems to be one of the reasons why the $SiO_2$ layer is formed unintentionally between the Si substrate and the $CeO_2$ film. Specifically, if the lattice is out of order in the $CeO_2$ layer already formed, then oxygen (O) atoms are easily transmitted through those disordered parts. As a result, a greater number of oxygen atoms are supplied onto the surface of the Si substrate. In addition, a great number of dangling bonds also exist on parts of the surface of the Si substrate just under the disordered parts of the $CeO_2$ crystal lattice, and therefore oxygen is easily bonded to those parts, thus promoting the formation of the $SiO_2$ layer.

In view of these findings, the present inventors arrived at the idea that if monatomic Ce and O layers are stacked one upon the other on an Si(001) substrate with Ce and oxygen alternately supplied onto the Si(001) substrate and with Ce, La and oxygen supplied in controlled amounts, then a $CeO_2(011)$ film with double domains will not be formed but a single crystal $CeO_2(001)$ film can be formed. That is to say, we paid special attention to the fact that when crystals of a $CeO_2(001)$ film with a fluorite-type crystal structure grow, a layer where only Ce atoms exist and a layer where only oxygen atoms exist will appear alternately and repeatedly at regular intervals in the crystal lattice.

Taking these results into consideration, we also acquired the idea that if Ce and oxygen are alternately supplied after a thin film having a structure continuous with the diamond cubic structure of Si (e.g., an oxide with a fluorite-type crystal structure) has been formed on the Si(001) substrate, then a $CeO_2(011)$ film with double domains will not be formed but a single crystal $CeO_2(001)$ film can be formed.

Furthermore, we got the idea that even a metal oxide layer containing a metal other than Ce can be formed to show excellent crystallinity by taking measures for suppressing reaction between Si and O and that a ferroelectric layer with good orientations should be formed on the metal oxide layer.

Hereinafter, the present invention, which is a natural result of these findings, will be described.

A first inventive dielectric film forming method includes the steps of:(a) preparing a substrate including a crystalline semiconductor layer; (b) forming an underlying layer, which consists essentially of a metal material, on the crystalline semiconductor layer; (c) forming a metal oxide layer by oxidizing at least part of the underlying layer with oxygen supplied thereto from above the underlying layer; and (d) forming a ferroelectric layer on the metal oxide layer.

According to this method, an excellently crystalline underlying layer is formed while preventing an oxide film from being formed due to oxidation of a semiconductor material. Thus, a ferroelectric layer with good orientations is formed on the metal oxide layer, which part or all of the underlying layer. Consequently, a dielectric film qualified for a ferroelectric device can be obtained.

The step (c) may be performed in parallel with the step (d) by using oxygen supplied in the step (d) to form the ferroelectric layer.

The underlying layer formed in the step (b) preferably consists essentially of at least one metal material selected from the group consisting of Mg, Zr, Y, Ce, La and Bi.

The method may further include the step of forming a thermal oxide film by thermally oxidizing a surface of the crystalline semiconductor layer after the step (a) and before the step (b). In the step (b), the underlying layer consisting essentially of the metal material may be formed on the thermal oxide film. In this manner, a thermal oxide film showing high affinity for the semiconductor layer can be used and yet the thermal oxide film, underlying layer and ferroelectric layer can be formed with almost no interdiffusion caused among them. Consequently, a dielectric film qualified for a ferroelectric memory device can be formed easily.

A second inventive dielectric film forming method includes the steps of:(a) preparing a substrate including a crystalline semiconductor layer; (b) forming an underlying layer, which consists essentially of a metal material, on the crystalline semiconductor layer, where affinity of the metal material for oxygen is higher than affinity of a semiconductor material of the semiconductor layer for oxygen; (c) forming a Ce layer on the underlying layer; and (d) forming at least a $CeO_2$ layer by supplying oxygen from above the Ce layer.

According to this method, an excellently crystalline $CeO_2$ layer can be formed while preventing an oxide film from being formed out of the semiconductor material. Thus, even if the dielectric film is relatively thick, the dielectric film has large capacitance per unit area, small leakage current and high breakdown strength.

In the step (d), at least part of the underlying layer is preferably oxidized.

The steps (b) through (d) are preferably performed continuously within an ultrahigh vacuum epitaxial growth system.

The steps (b) and (c) are preferably performed by an MBE process using an EB evaporation system.

The underlying layer formed in the step (b) preferably consists essentially of at least one metal material selected from the group consisting of Mg, Zr, Y, Ce, La and Bi.

A third inventive dielectric film forming method includes the steps of: (a) preparing an Si substrate; and (b) forming a $CeO_2$ film on the Si substrate by an epitaxy process using metal Ce as a source material.

According to this method, Ce can be supplied independently onto the surface of an Si substrate before oxygen is supplied thereto. Thus, it is possible to suppress the formation of an $SiO_2$ layer on the surface of the Si substrate. For example, by evaporating and supplying metal Ce using a K-cell or a valved cracking cell, a Ce layer can be deposited at a deposition rate of 5 nm/min. or less. As a result, its thickness is controllable with a precision corresponding to is the thickness of several atomic layers (5 Å) or less, and therefore, a $CeO_2$ film with a desired plane orientation can be formed.

If the principal surface of the Si substrate is a (001) plane, then a surface of the $CeO_2$ film can also be a (001) plane. Thus, it is possible to prevent the generation of double domains, which are observed when a $CeO_2$ film with a (011) film surface is formed. As a result, an excellently crystalline $CeO_2$ film can be formed.

In the step (b), at least one atomic layer of Ce may be formed on the Si substrate. Then, it is possible to prevent an $SiO_2$ layer from being formed on the Si substrate with more certainty.

In the step (b), Ce alone and oxygen alone may be alternately and repeatedly supplied such that monatomic O layers and monatomic Ce layers are formed alternately on the at least one Ce atomic layer located on the Si substrate. In this manner, it is possible to prevent a $CeO_2$ film with a (011) surface from being formed.

A first inventive dielectric film includes:an underlying layer formed on a crystalline semiconductor layer and made of a metal material, the affinity of the metal material for oxygen being higher than affinity of a semiconductor material of the semiconductor layer for oxygen; and a crystalline $CeO_2$ film formed on the underlying layer.

In this structure, an oxide film of a material for a semiconductor layer, e.g., a silicon dioxide film, is less likely to be formed on the semiconductor layer. Thus, a dielectric film with a large capacitance per unit area can be formed to include an underlying layer with a high dielectric constant and a crystalline $CeO_2$ layer. Consequently, the leakage current can be reduced and the breakdown strength can be increased by thickening the dielectric film sufficiently.

In the first dielectric film, at least part of the underlying layer has preferably been oxidized.

A second inventive dielectric film includes: an underlying layer formed on a crystalline semiconductor layer and made of a compound oxide containing a metal element and a semiconductor material for the semiconductor layer; and a crystalline $CeO_2$ layer formed on the underlying layer.

In this manner, a dielectric film, which includes:an underlying layer showing high affinity for the semiconductor layer, low distortion and low interface levels; and a $CeO_2$ layer with a high dielectric constant, can be obtained.

A third inventive dielectric film includes: an underlying layer formed on a crystalline semiconductor layer and made of a crystalline metal oxide that substantially lattice-matches crystals of the semiconductor on the principal surface of the semiconductor layer; and a crystalline $CeO_2$ layer formed on the underlying layer.

In this manner, a dielectric film including an excellently crystalline $CeO_2$ layer, which has reflected information about the crystal structure of a semiconductor layer by way of an underlying layer, can be obtained.

A fourth inventive dielectric film includes: an underlying layer formed on a crystalline semiconductor layer and made of at least one metal material selected from the group consisting of Mg, Zr, Y, Ce, La and Bi; and a ferroelectric layer formed on the underlying layer.

In this manner, an underlying layer including almost no oxide film of the semiconductor material, e.g., silicon dioxide film, and a ferroelectric layer with good orientations can be obtained. Thus, it is possible to effectively impart a voltage applied to the entire dielectric film to the ferroelectric layer. Consequently, the ferroelectric layer attains sufficiently large residual polarization.

In the fourth dielectric film, at least part of the underlying layer has preferably been oxidized.

A fifth inventive dielectric film includes: an oxide layer formed on a crystalline semiconductor layer and made of an oxide of a semiconductor material for the semiconductor layer; an underlying layer formed on the oxide layer and made of an oxide of a metal material; and a ferroelectric layer formed on the underlying layer.

A layer made of an oxide of a semiconductor material for a semiconductor layer shows low interface levels and very high affinity for the semiconductor layer. By taking advantage of these properties, a very reliable dielectric film including a ferroelectric layer with good orientations can be obtained.

BRIEF DESCRIPTION OF THE DRAWINGS

FIGS. 21a–c are schematic plan views illustrating orientations of $CeO_2$ crystals, which grows epitaxially on (001), (111) and (110) planes of an Si substrate respectively, as disclosed in the sixth document.

DESCRIPTION OF THE PREFERRED EMBODIMENTS

Embodiment 1

Hereinafter, a first embodiment of the present invention relating to a method and system for forming a dielectric film will be described with reference to the drawings.

Figure 1:
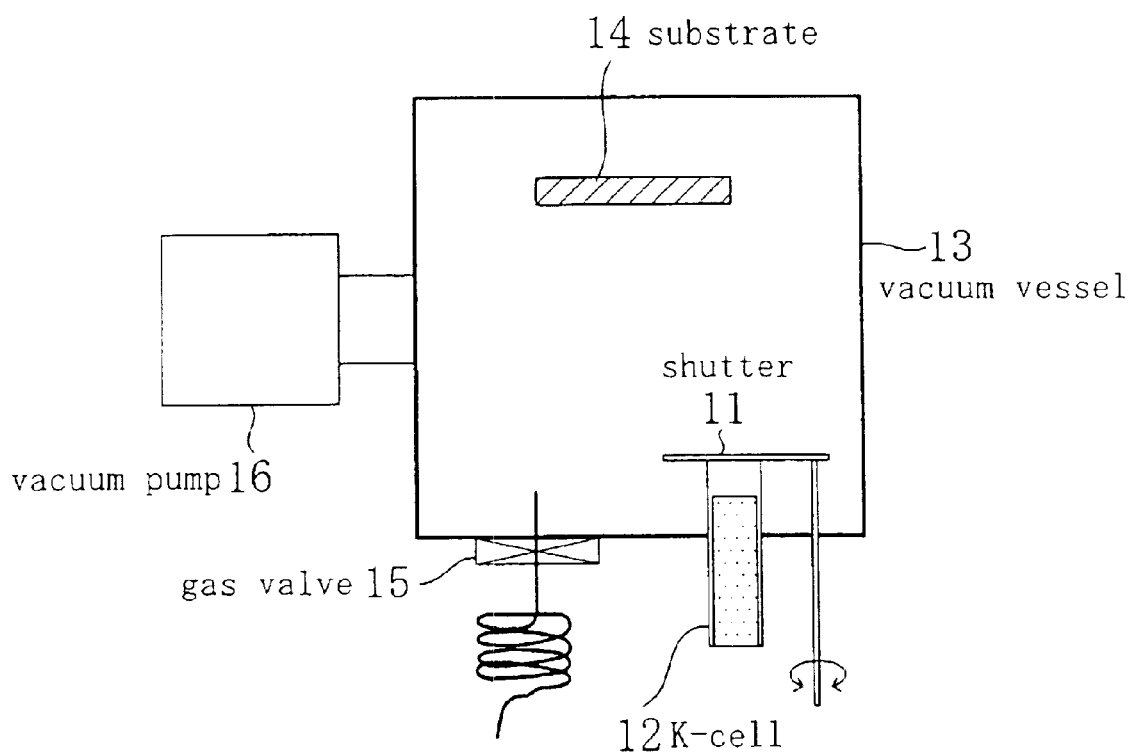
FIG. 1 is a cross-sectional view schematically illustrating an arrangement of an MBE system including a K-cell according to a first embodiment of the present invention.

FIG. 1 is a cross-sectional view schematically illustrating an arrangement of an MBE system, which is a dielectric film forming system including a K-cell according to the first embodiment of the present invention. The MBE system includes: a vacuum vessel 13 in which MBE growth or deposition is produced; a vacuum pump 16 for reducing the pressure inside the vacuum vessel 13; a K-cell 12 in which metal Ce for forming a $CeO_2$ thin film is stored; a shutter 11 for controlling the amount of Ce supplied into the vacuum vessel 13; and a gas valve 15 for controlling the flow rate of oxygen gas supplied into the vacuum vessel 13. The system is so constructed as to produce MBE growth or deposition with a substrate 14, which is an object to be processed, placed on a sample stage (not shown).

And the system is constructed to supply Ce as a so-called "molecular beam" by controlling the opened/closed states of the shutter 11. Also, by controlling the gas valve 15, which is provided along with the K-cell 12 for the vacuum vessel 13, oxygen can be supplied into the vacuum vessel 13 continuously and separately from Ce. In addition, the flow rate of oxygen can also be controlled such that oxygen is supplied regularly for just a short period of time by pulse flow (i.e., as a so-called "molecular beam"). That is to say, the gas valve 15 is provided with a solenoid valve, which can be opened or closed within 0.1 second. Moreover, when the solenoid valve is closed, the leakage rate thereof can be suppressed to $1 \times 10^{-5}$ cc/sec. or less.

Next, it will be described how to perform the MBE process. Before a $CeO_2$ thin film is formed, metal Ce, which is stored in the K-cell 12 and loaded into the vacuum vessel 13, is heated. The melting point of metal Ce is about 860° C., while the K-cell 12 is so constructed as to be heatable up to a temperature between about 1200 and about 1300 °C. In this embodiment, the K-cell 12 is heated up to a temperature higher than that actually set for forming a thin film and then kept at the temperature for several tens minutes to several hours. At this point in time, the substrate 14 has not been loaded into the MBE system yet. Thereafter, the K-cell 12 is cooled down to a temperature set for no operation and kept at the temperature for several hours or more with almost no Ce evaporated or sublimated. The inside of the MBE system is always evacuated by the vacuum pump 16. By performing these operations, impurities contained in metal Ce and contaminants existent around its surface or adhered to the K-cell 12 can be vaporized. Accordingly, in actually forming a thin film, Ce atoms can be supplied into the vacuum vessel 13 using high-purity metal Ce, from which most of those impurities and contaminants has been removed. As a result, an excellently crystalline $CeO_2$ thin film can be formed as will be described later.

On the other hand, the substrate 14 to be processed is prepared in the following manner. The substrate 14, which is an Si substrate with a LOCOS film and so on formed thereon, is cleaned, dipped in a solution containing hydrogen fluoride (HF) or ammonium fluoride ($NH_4F$), rinsed with water, dried and then loaded into the MBE system immediately to produce crystal growth thereon. At this time, the surface of the substrate 14 is covered with hydrogen (H) atoms or a very thin $SiO_2$ amorphous layer as a result of these operations. The principal surface of the Si substrate is preferably a (001) plane. Alternatively, the principal surface of the Si substrate may be a (111) plane, a plane with any other higher-order index or an off-axis plane tilted from any of these planes by several degrees. And when the substrate 14 is heated up to a temperature between 100 and 400° C. within the MBE system, water and adsorbed gases remaining on the surface of the substrate 14 are removed. Thereafter, the substrate 14 is further heated to, and kept at, a temperature between 800 and 900° C. At this time, the H atoms and the thin $SiO_2$ amorphous layer, which have covered the surface of the substrate 14, are also desorbed. As a result, a clean and smooth surface of the substrate 14 is exposed inside the vacuum vessel 13.

Figure 2A:
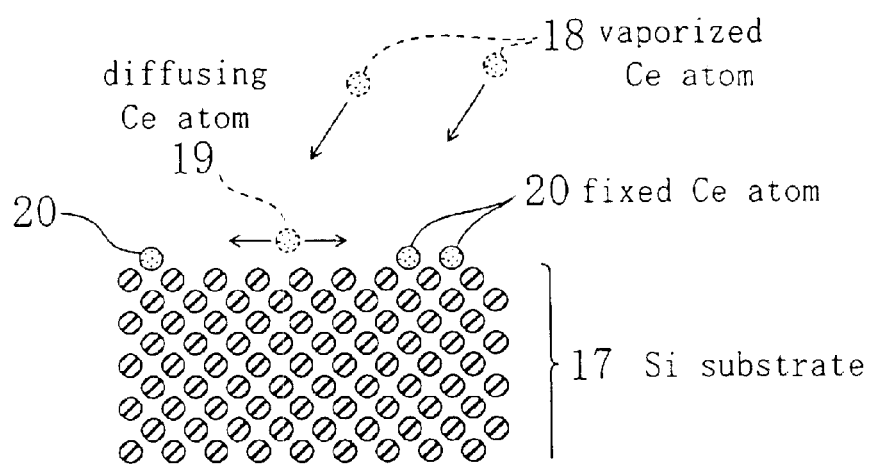
FIGS. 2(a) through 2(c) illustrate a process through which a $CeO_2$ film is formed in accordance with the first embodiment of the present invention.
Figure 2B:
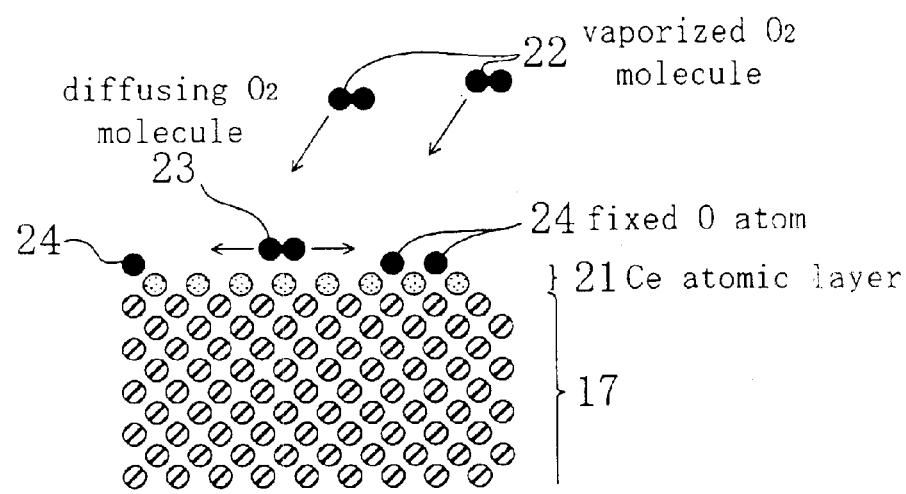
Figure 2C:
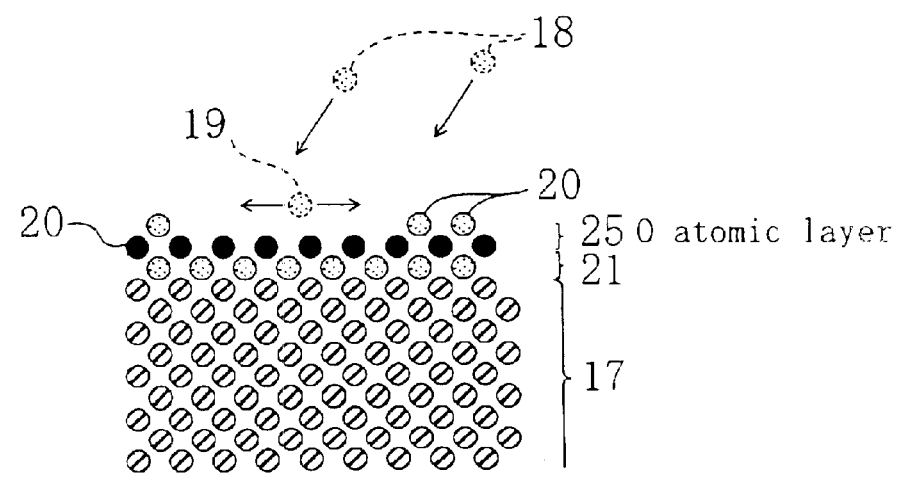

FIGS. 2(a) through 2(c) illustrate a process through which a $CeO_2$ film is formed.

First, as shown in FIG. 2(a), when Ce is supplied into the vacuum vessel 13, vaporized Ce atoms 18 collide against the exposed clean and smooth surface of the Si substrate 17. At this point in time, the shutter 11 is opened and the gas valve 15 is closed. Diffusing Ce atoms 19, which have reached the Si substrate 17, diffuse within the plane of the substrate so as to settle at respective locations that should be lattice sites of $CeO_2$ crystals continuous with the crystal lattice of the Si substrate 17 with the diamond structure. As a result, the diffusing Ce atoms 19 become fixed Ce atoms 20. In this case, the temperature of the substrate is kept low. Accordingly, the diffusing Ce atoms 19 diffuse around the locations where those atoms 19 have come into contact with the Si substrate 17 for the first time, and then are incorporated into the crystal lattice so as to be the fixed Ce atoms 20 at respective sites where these atoms 19 are most stabilized. Thus, no three-dimensional growth is produced, i.e., no big islands are formed of these Ce atoms alone. Also, by precisely defining the interval during which the shutter 11 is opened, the amount of Ce supplied is controlled and the amount of Ce, which is supplied in excess of that required for covering the surface of the Si substrate 17 with one atomic layer, i.e., the amount of Ce supplied excessively, is minimized. However, to eliminate defects from the interface between the Si substrate 17 and the $CeO_2$ layer, Ce should be supplied slightly in excess. Part of the Ce atoms supplied excessively remain near the fixed Ce atoms 20 on the surface of the substrate, while the rest is desorbed again without being fixed on the substrate. That is to say, the diffusing Ce atoms 19, which have reached the surface of the Si substrate 17, are dispersed over the Si substrate 17 almost two-dimensionally so as to be the fixed Ce atoms 20. As a result, a monatomic layer is formed. A crystal growth process like this is called a migration enhanced epitaxy (MEE) mode.

Next, as shown in FIG. 2(b), when the surface of the Si substrate 17 is completely covered with the fixed Ce atoms 20 to form the monatomic Ce layer 21, the gas valve 15 is opened to supply vaporized $O_2$ molecules 22. At this point in time, the shutter 11 has already been closed. Those diffusing $O_2$ molecules 23, which have reached the surface of the substrate covered with the Ce atomic layer 21, diffuse within the substrate plane and then react with the fixed Ce atoms 20 in the Ce atomic layer 21 to form bonds and to be fixed O atoms 24, which are incorporated into the crystal lattice of the $CeO_2$ layer. As a result, a monatomic O layer 25 consisting of those fixed O atoms 24 alone is formed on the Ce atomic layer 21 that has already been formed. In this case, the other diffusing Ce atoms 19, which didn't enter the lattice sites but have remained on the Ce atomic layer 21, are removable by themselves. However, the amount of Ce supplied should preferably be controlled in such a manner as to eliminate excessive Ce atoms as much as possible.

In this case, the amount of oxygen supplied is also limited as well as Ce is. If oxygen is not supplied sufficiently, then $CeO_2$ might be short of O atoms and $Ce_6O_{11}$ or $Ce_2O_3$ crystals might be formed unintentionally. Then, the crystallinity will deteriorate as a whole. However, if oxygen is supplied too much, then an $SiO_2$ layer might be formed, thus causing the problems. Therefore, according to this embodiment, oxygen is supplied using the gas valve 15 that can supply oxygen by pulse flow. By using this valve, oxygen can be supplied with high pressure in a very short time while the surface of the substrate is covered with the Ce atomic layer 21. If oxygen is supplied with that high pressure, the density of oxygen atoms is high when those atoms reach the surface of the substrate. As a result, reaction between the O and Ce atoms is promoted. However, after the surface of the Ce atomic layer 21 has been completely covered with the fixed O atoms 24, those excessive diffusing O molecules 23 desorb themselves from the surface of the substrate into the vacuum vessel 13 so as to be exhausted by the vacuum pump 16. Since no oxygen gas but the pulsed one is supplied, almost no oxygen exists inside the vacuum vessel 13. Accordingly, the diffusing $O_2$ molecules 23 rarely form an $SiO_2$ layer by penetrating into the surface of the substrate 17.

Subsequently, as shown in FIG. 2(c), after the Ce and O atomic layers 21 and 25 have been stacked on the Si substrate 17, the shutter 11 is opened to supply Ce into the vacuum vessel 13 again. Then, vaporized Ce atoms 18 reach the surface of the substrate, some of those atoms 18 diffuse as diffusing Ce atoms 19 and part of the atoms 19 turn into fixed Ce atoms 20. That is to say, another Ce atomic layer 21 is formed on the substrate by the same action as that described above. By alternately and repeatedly supplying oxygen and Ce after that, multiple Ce atomic layers 21 and multiple O atomic layers 25 can be alternately stacked one upon the other.

Figure 3:
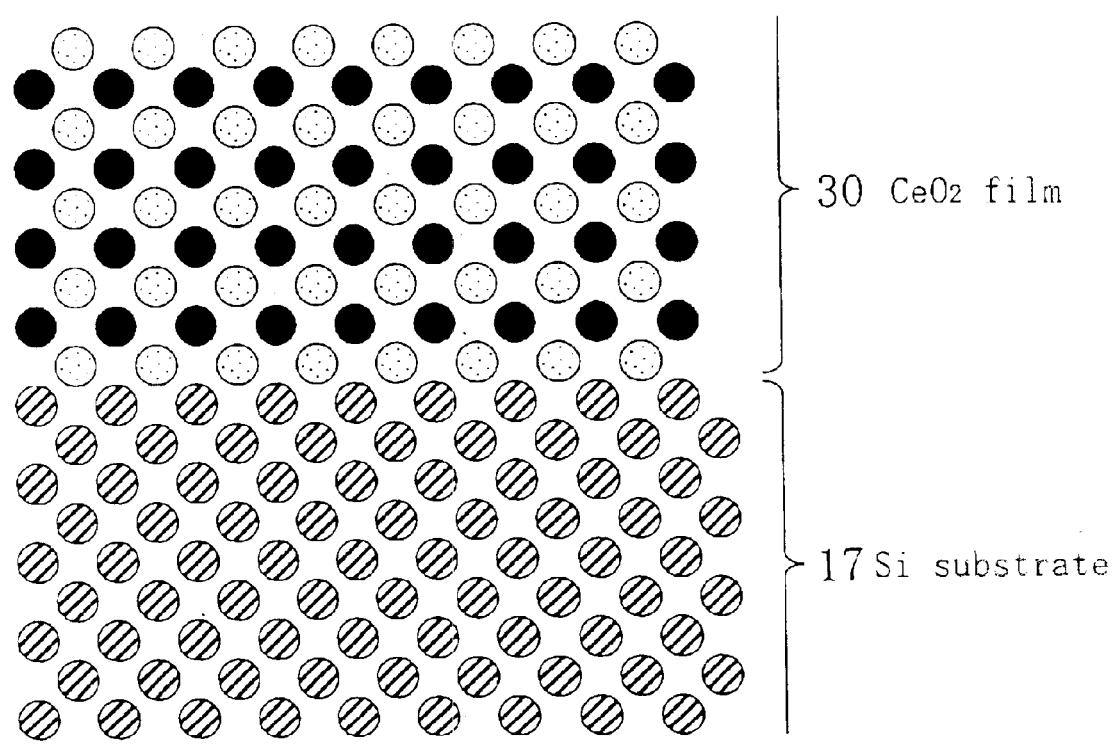
FIG. 3 is a schematic cross-sectional view illustrating a crystal structure of the $CeO_2$ film formed by a method according to the first embodiment of the present invention.

As a result, a $CeO_2(001)$ layer 30 is formed on the si(001) substrate as shown in FIG. 3.

Figure 19:
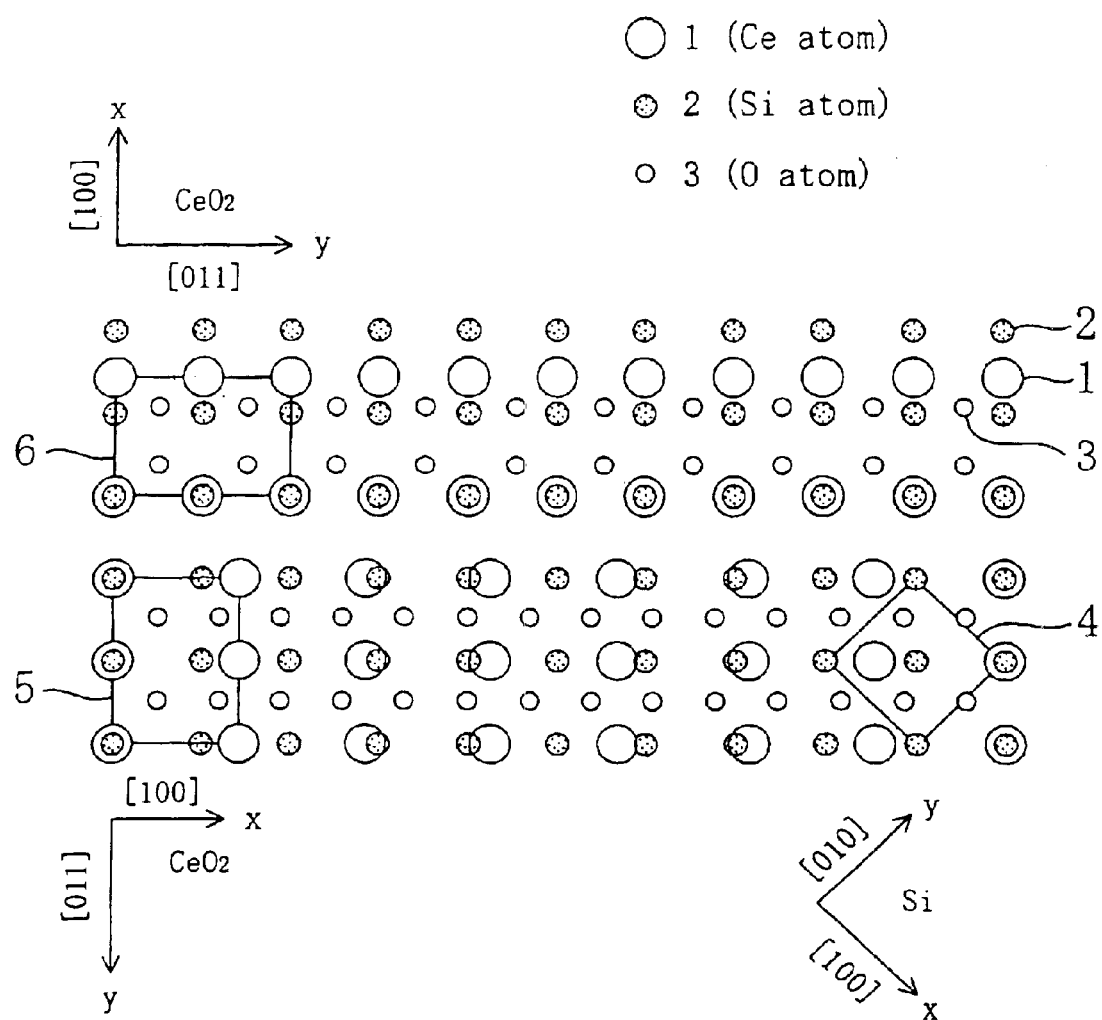
FIG. 19 is a schematic plan view illustrating how $CeO_2$ crystals grow epitaxially on a (001) plane of an Si substrate as disclosed in the fifth document.
Figure 20:
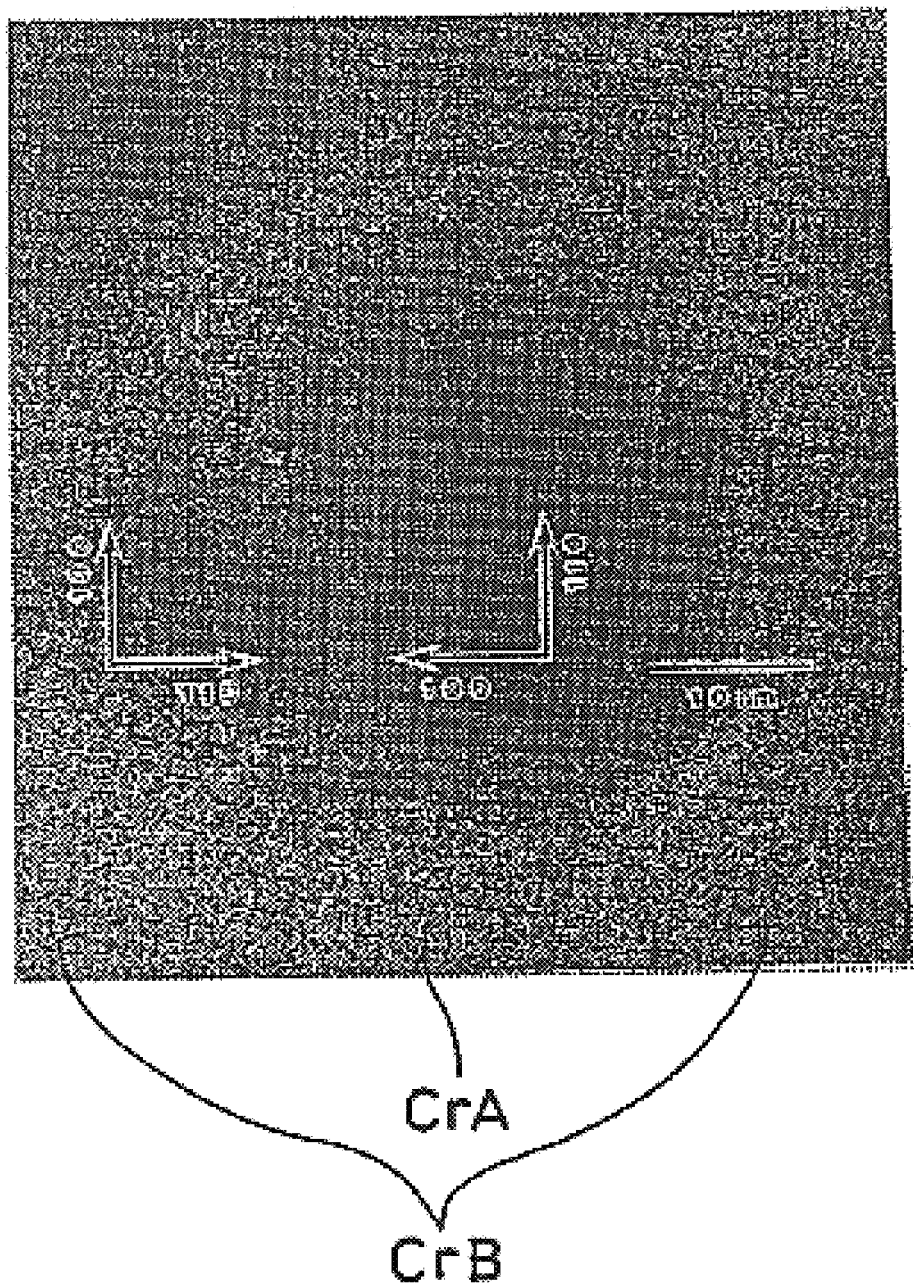
FIG. 20 is a microgram obtained by observing the coexistence of two domains in a $CeO_2$ film using a high-resolution scanning tunneling electron microscope as disclosed in the fifth document.
Figure 21A:
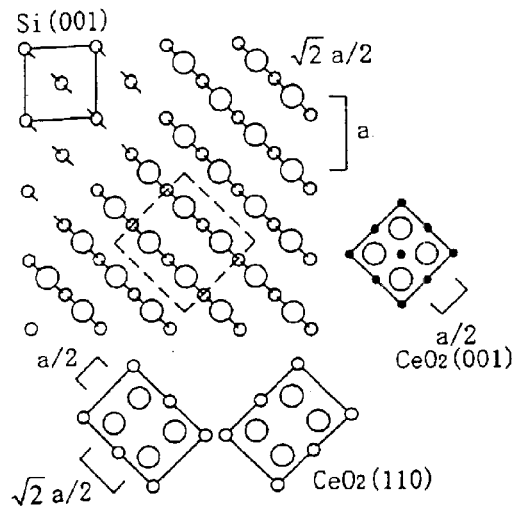
Figure 21B:
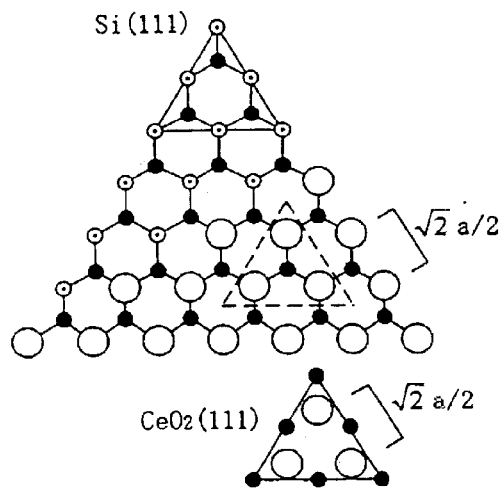
Figure 21B:
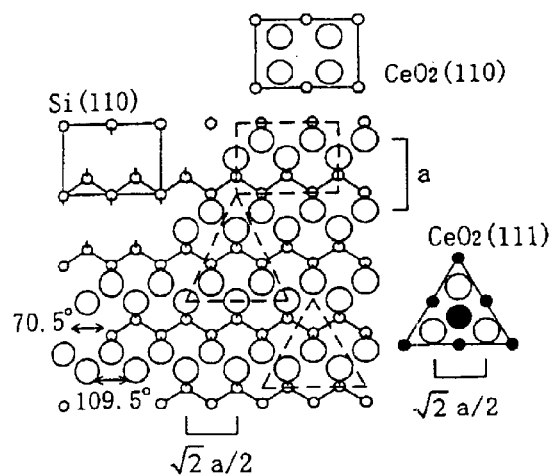

In accordance with the film forming method of this embodiment, oxygen and Ce are supplied alternately and repeatedly, thereby stacking multiple Ce and O atomic layers 21 and 25 alternately. As a result, the $CeO_2(001)$ layer 30 with excellent crystallinity can be formed on the Si(001) substrate. As already described, if epitaxial growth is produced as in the conventional fabrication process under such conditions that O and Ce atoms are supplied at a time, then crystals growing are more likely to form (011) planes. In contrast, if monatomic layers of the two types are formed alternately in the MEE mode as is done in this embodiment, no $CeO_2(011)$ film, in which Ce and O atoms coexist in a common lattice plane as shown in FIG. 19, is formed. That is to say, a double-domain-free, excellently crystalline $CeO_2$ (001) film can be formed easily.

In addition, metal Ce is evaporated using the K-cell 12 in the fabrication system of this embodiment. Thus, the following effects are attainable.

The highest possible purity of metal Ce currently available for industrial production is on the order of 99.9%. We must say this purity is rather low, considering that metal source materials with a purity of 99.99999% (7N) are available as for metal Ga or metal arsenic (As) for use in MBE growth of Group III-V semiconductors. In addition, metal Ce cannot be left in the air, because metal Ce is oxidized very easily and oxidation reaction continuously occurs due to deep penetration of oxygen even after its surface has been oxidized. Furthermore, metal Ce also reacts with water slowly to form an oxide and produce hydrogen. Accordingly, it is usually necessary to pre-treat metal Ce by coating its surface with oil, wrapping it with a sheet of oiled paper or reserving it in a liquid in which neither the air nor water is soluble. Thus, oil is usually deposited on the surface of metal Ce. In other words, metal Ce, which does not have so high purity and is contaminated with oil, must be ordinarily used. Therefore, if a $CeO_2$ thin film is formed using commercially available metal Ce as a source material as it is, then a lot of contaminants will be contained in the resultant film. As a result, there is a concern about degradation in crystallinity and insulating properties thereof. Furthermore, dopant ions might move during the operation of the device, thus deteriorating the electrical characteristics and reliability thereof with time.

Because of these reasons, powder or pellet of $CeO_2$ sintered compact is used as a source material for forming a $CeO_2$ thin film in all of the first through sixth documents except for the fourth. As a result, various inconveniences are caused: an $SiO_2$ layer is formed on the surface of an Si substrate; or a $CeO_2(011)$ crystal film with double domains is formed on an Si(001) substrate.

In contrast, according to this embodiment, the vacuum vessel 13 is provided with the K-cell 12, where metal Ce is stored, heated and then evaporated. Thus, before a $CeO_2$ thin film is formed, the purity of metal Ce can be increased by heating only the metal Ce and thereby vaporizing and eliminating contaminants such as oil and other high-vapor-pressure impurities originally contained in the metal Ce. And by using that high-purity metal Ce, a $CeO_2$ (001) thin film with high insulating properties and crystallinity can be formed.

Figure 4:
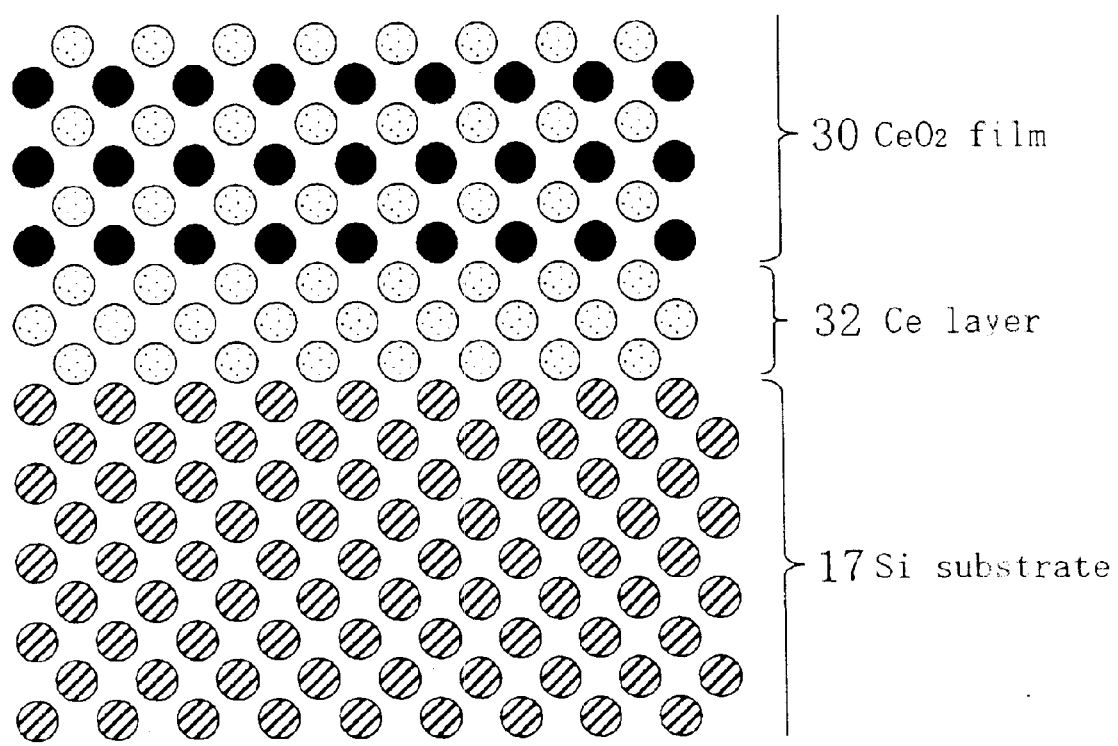
FIG. 4 is a schematic cross-sectional view illustrating a crystal structure of the $CeO_2$ film formed by a method according to a modified example of the first embodiment of the present invention.

Optionally, a Ce layer 32, consisting of multiple Ce atomic layers, may be formed on the Si substrate 17 as shown in FIG. 4. This is a structure devised in view of the fact that usually the surface of the Si substrate 17 is not entirely smooth at an atomic layer level.

That is to say, steps with a height corresponding to several atomic layers usually exist here and there on the surface of the Si substrate 17. Thus, if only the monatomic Ce layer 21 such as that shown in FIG. 2(b) is formed on that surface, then the sidewalls of those steps could not be covered with Ce. In that case, an $SiO_2$ layer might be formed as a result of direct bonding of O atoms to Si atoms or a $CeO_2(011)$ film might be partially formed. Accordingly, to avoid that situation where the surface of the Si substrate 17 is not covered with the Ce atoms but exposed, it would be advantageous to deposit the Ce layer 32 consisting of multiple Ce atomic layers.

Nevertheless, if too many Ce atoms are vertically stacked one upon the other on the Si substrate 17, then a lattice structure of metal Ce crystals will be formed. In that case, information about the crystal structure of the Si substrate 17 could not be conveyed to the overlying $CeO_2$ film. Thus, the number of Ce atomic layers stacked is preferably four (about 5 Å) or less.

In the foregoing embodiment, a technique of forming a $CeO_2(001)$ crystal film on an Si(001) substrate has been exemplified. Even in forming a $CeO_2(111)$ film on an Si(111) substrate, Ce and oxygen can also be alternately supplied onto the Si substrate in the same way. Thus, it is also possible to avoid various inconveniences like degradation in crystallinity due to the formation of an $SiO_2$ layer or decrease in dielectric constant.

Embodiment 2

Next, a second embodiment of the present invention will be described.

Figure 5:
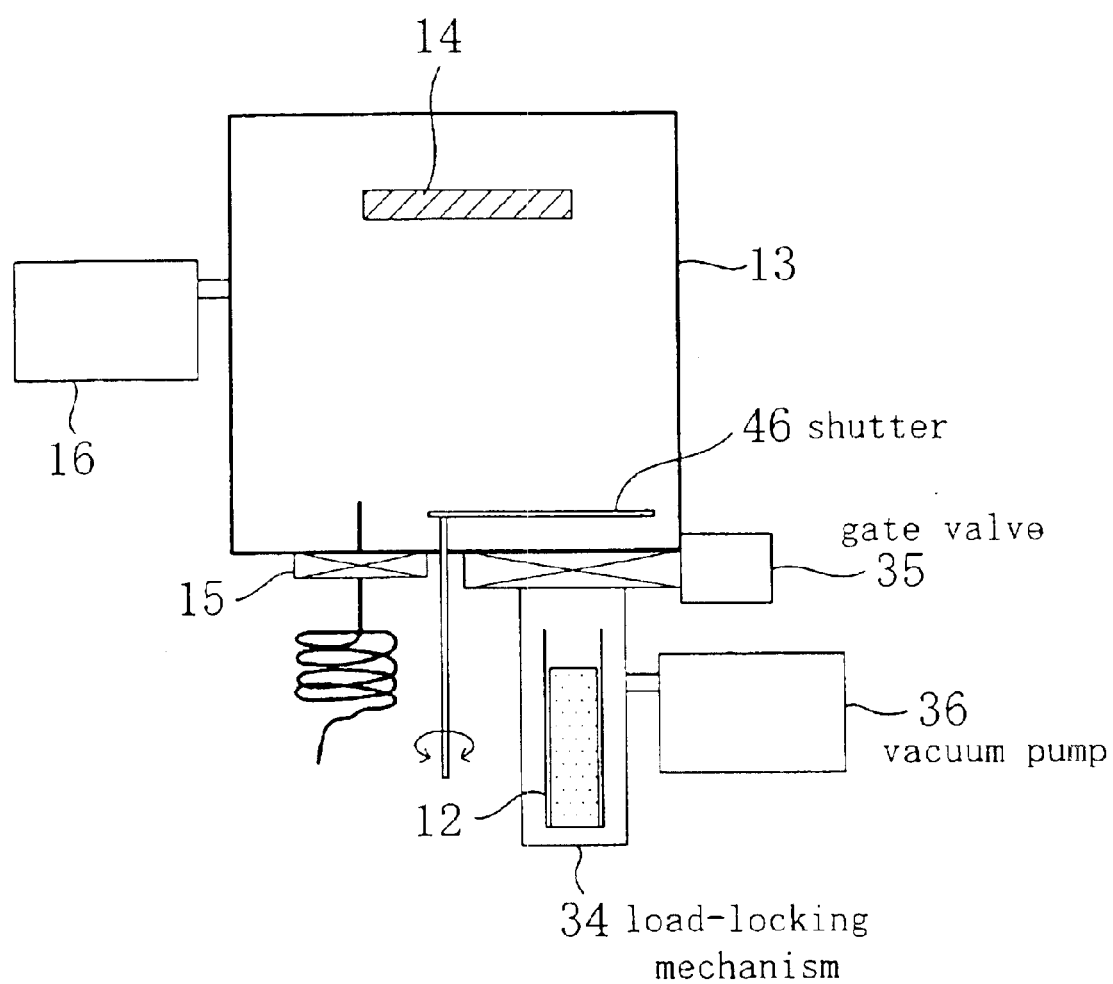
FIG. 5 is a cross-sectional view schematically illustrating an arrangement of an MBE system including a load-locking mechanism according to a second embodiment of the present invention.

FIG. 5 is a cross-sectional view schematically illustrating an arrangement of an MBE system for forming a $CeO_2$ thin film according to the second embodiment. In the MBE system according to this embodiment, the K-cell 12 storing metal Ce therein is placed inside a load-locking mechanism 34 as shown in FIG. 5. A gate valve 35 is interposed between the load-locking mechanism 34 and the vacuum vessel 13. When the gate valve 35 is closed, the load-locking mechanism 34 is shut off from the vacuum vessel 13 almost completely. The system is also constructed to control the supply of a so-called "molecular beam" of Ce by opening or closing the shutter 46. A vacuum pump 36 for reducing the pressure inside the load-locking mechanism 34 is further provided for the load-locking mechanism 34 separately from the vacuum pump 16 for reducing the pressure inside the vacuum vessel 13. The other parts of the MBE system according to the second embodiment are the same as the counterparts of the MBE system according to the first embodiment.

Next, it will be described how to perform the MBE process according to this embodiment.

Before a $CeO_2$ thin film is formed, metal Ce, which is stored in the K-cell 12, is heated. At this point in time, the gate valve 35 is closed and the load-locking mechanism 34 is shut off from the vacuum vessel 13. Thus, Ce containing impurities and contaminants does not penetrate the vacuum vessel 13. The K-cell 12 is heated up to a temperature higher than that actually set for forming a thin film and then kept at the temperature for several tens minutes to several hours. Thereafter, the K-cell 12 is cooled down to a temperature set for no operation. The inside of the load-locking mechanism 34 is always evacuated by the vacuum pump 36. By performing these operations, impurities contained in metal Ce and contaminants existent around its surface or adhered to the K-cell 12 can be vaporized. During these operations, the vacuum vessel 13 is not contaminated, either. Accordingly, in actually forming a thin film, high-purity metal Ce, from which most of impurities and contaminants has been removed, can be supplied. In addition, almost no contaminants are left in the atmosphere. As a result, an excellently crystalline $CeO_2$ thin film can be formed.

Thereafter, the substrate 14 is cleaned and then loaded into the system to form a $CeO_2$ thin film thereon. These process steps are the same as the counterparts of the first embodiment, and the detailed description thereof will be omitted herein.

In the method for forming a $CeO_2$ film according to this embodiment, Ce and oxygen are alternately supplied onto the substrate 14 using the K-cell 12 and the gas valve 15. Thus, an excellently crystalline $CeO_2(001)$ film can be formed on an Si(001) substrate as in the first embodiment.

In addition, the K-cell is placed inside the load-locking mechanism in the MBE system according to this embodiment. Thus, impurities contained in metal Ce and contaminants existent around its surface or adhered to the K-cell can be removed even more effectively. Moreover, it is possible to effectively prevent the inside of the vacuum vessel from being contaminated. As a result, an excellently crystalline $CeO_2$ thin film can be formed using high-purity Ce from which most of impurities and contaminants has been removed.

As in the first embodiment, a $CeO_2(111)$ film may also be formed on a (111) substrate according to the second embodiment.

Embodiment 3

Next, a third embodiment of the present invention will be described.

Figure 6:
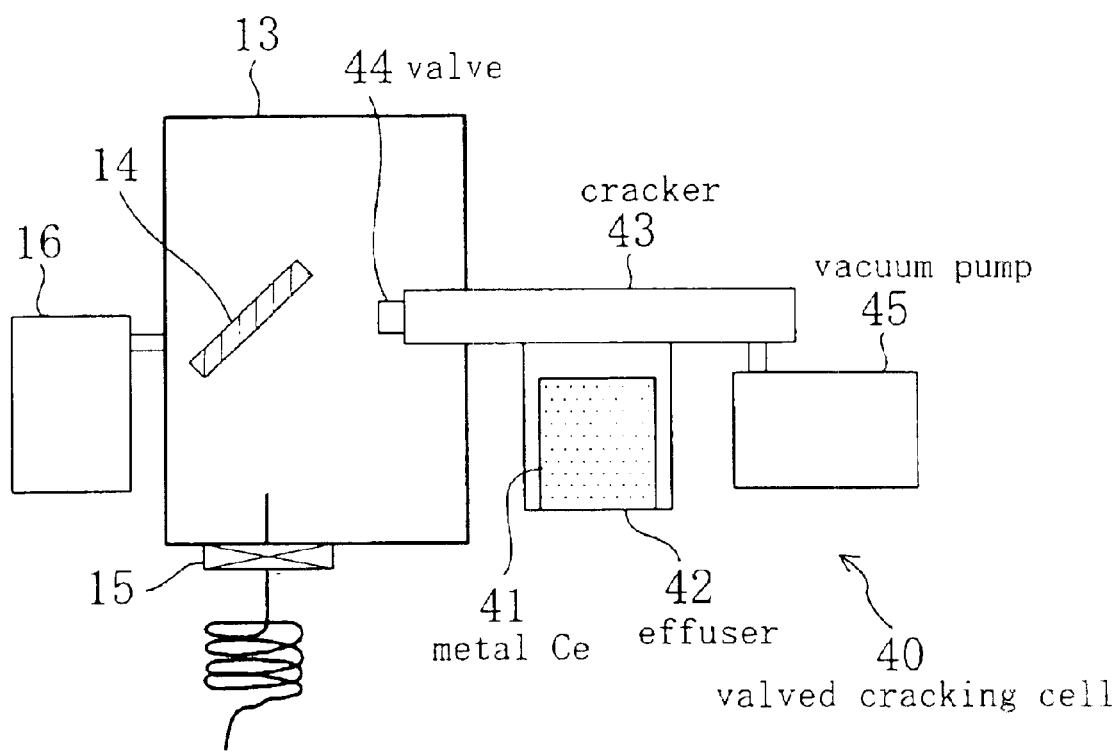
FIG. 6 is a cross-sectional view schematically illustrating an arrangement of an MBE system including a valved cracking cell according to a third embodiment of the present invention.

FIG. 6 is a cross-sectional view schematically illustrating an arrangement of an MBE system according to the third embodiment. As shown in FIG. 6, the MBE system of the third embodiment is provided with a valved cracking cell 40. The valved cracking cell 40 includes: an effuser 42 for storing metal Ce 41 therein; a cracker 43 for further heating and cracking a sublimated gas; a valve 47 interposed between the cracker 43 and the vacuum vessel 13; and a vacuum pump 45 for reducing the pressure inside the valved cracking cell 40 independent of the vacuum vessel 13. The valve 44 has high airtightness and can shut off the valved cracking cell 40 from the vacuum vessel 13 almost completely. This system is also constructed such that Ce can be supplied as a so-called "molecular beam" and the molecular beam supplied onto the substrate 14 is controllable sharply by operating the valve 44. The other parts of the MBE system according to the third embodiment are the same as the counterparts of the MBE system according to the first embodiment.

Next, it will be described how to perform the MBE process according to this embodiment. Before a $CeO_2$ thin film is formed, metal Ce 41, which is stored in the valved cracking cell 40, is heated. At this point in time, the valve 44 is closed and the valved cracking cell 40 is completely shut off from the vacuum vessel 13. Thus, Ce containing impurities and contaminants does not penetrate the vacuum vessel 13. Ce, which has been sublimated by the effuser 42 and the cracker 43, is heated up to a temperature higher than that actually set for forming a thin film and then kept at the temperature for several tens minutes to several hours. Thereafter, Ce is cooled down to a temperature set for no operation. The inside of the valved cracking cell 40 is always evacuated by the vacuum pump 45. By performing these heating operations, impurities contained in metal Ce and contaminants existent around its surface or adhered to the valved cracking cell 40 can be vaporized and then exhausted using the vacuum pump 45. Thus, clogging of the valve 44 can be suppressed. Also, during these operations, the vacuum vessel 13 is not contaminated, either. Accordingly, in actually forming a thin film, high-purity metal Ce, from which most of impurities and contaminants has been removed, can be supplied. In addition, almost no contaminants are left in the atmosphere. As a result, an excellently crystalline $CeO_2$ thin film can be formed.

Thereafter, the substrate 14 is cleaned and then loaded into the system to form a $CeO_2$ thin film thereon. These process steps are the same as the counterparts of the first embodiment, and the detailed description thereof will be omitted herein.

In the method for forming a $CeO_2$ film according to this embodiment, Ce and oxygen are alternately supplied onto the substrate 14 using the K-cell 12 and the gas valve 15. Thus, an excellently crystalline $CeO_2(001)$ film can be formed on an Si(001) substrate as in the first embodiment.

In addition, metal Ce is placed inside the valved cracking cell in the MBE system according to this embodiment. Thus, impurities contained in metal Ce and contaminants existent around its surface or adhered to the cell can be removed even more effectively. Moreover, it is possible to effectively prevent the inside of the vacuum vessel from being contaminated. As a result, an excellently crystalline $CeO_2$ thin film can be formed using high-purity Ce from which most of impurities and contaminants has been removed.

As in the first embodiment, a $CeO_2(111)$ film may also be formed on a (111) substrate according to the third embodiment.

Embodiment 4

Next, a fourth embodiment of the present invention will be described.

Figure 7:
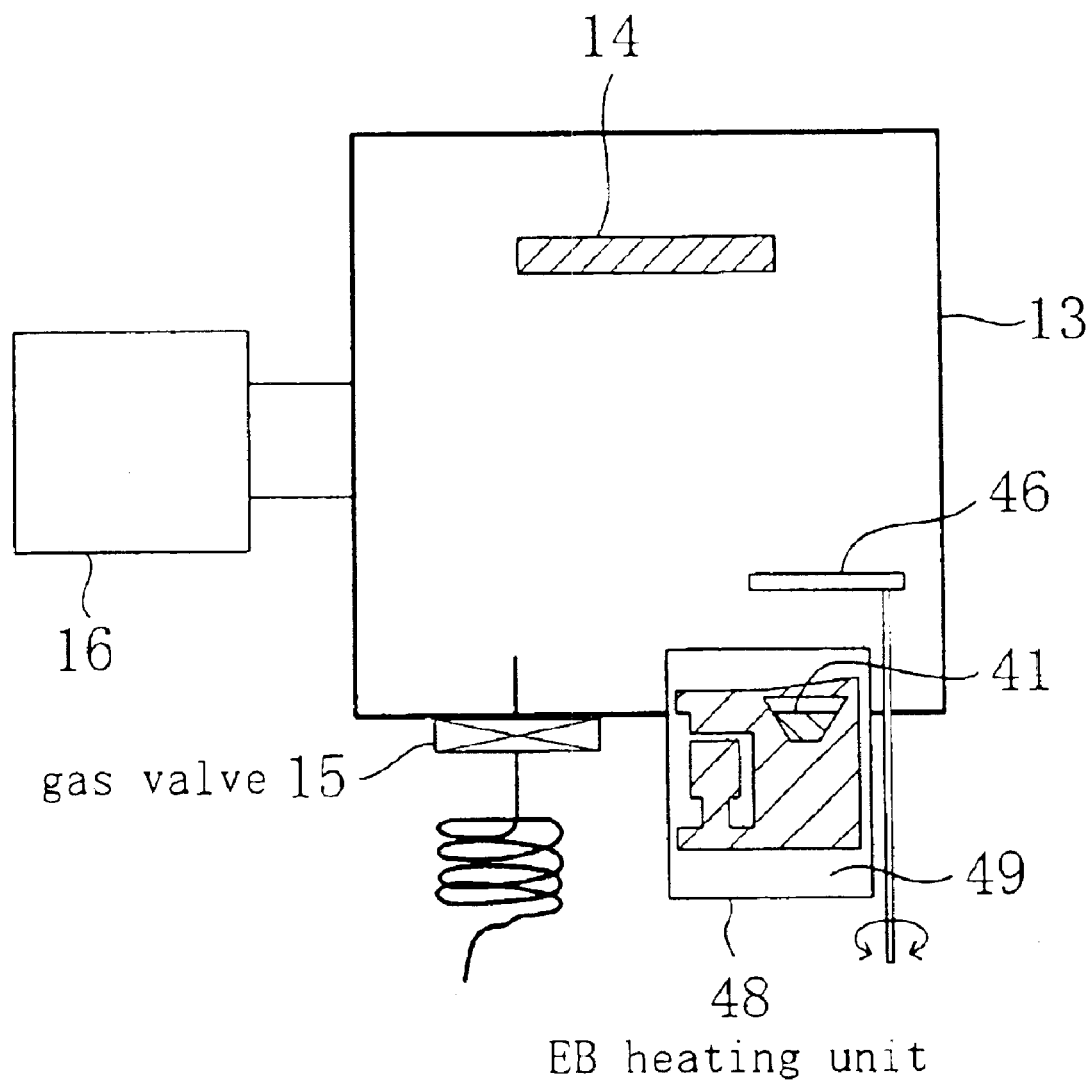
FIG. 7 is a cross-sectional view schematically illustrating an arrangement of an MBE system including an EB heating unit according to a fourth embodiment of the present invention.

FIG. 7 is a cross-sectional view schematically illustrating an arrangement of an MBE system according to the fourth embodiment. As shown in FIG. 7, the MBE system of this embodiment is provided with an EB heating unit 48. The EB heating unit 48 includes a mechanism 49 for carrying metal Ce 41 and heating the metal Ce 41 by irradiating it with an electron beam (EB). This system is also constructed such that Ce can be supplied as a so-called "molecular beam" by operating the shutter 46. The other parts of the MBE system according to the fourth embodiment are the same as the counterparts of the MBE system according to the first embodiment.

A part of the mechanism 49 in the EB heating unit 48 for directly carrying the metal Ce 41 thereon is preferably made of tungsten (W), molybdenum (Mo) or tantalum (Ta), not carbon (C) or copper (Cu) usually used for an EB unit. The reason is as follows. The melting point of Cu is around 1000° C., which is only 100 to 200° C. higher than that of Ce. Thus, while Ce is being fused and vaporized, Cu might also be fused and vaporized at the same time. Also, although the melting point of carbon is as high as around 3000° C., carbon easily forms a compound with Ce. Thus, a chemical reaction might be caused between carbon and Ce at 1000° C. or less to form a carbide and destroy the mechanism 49. In contrast, the melting points of W, Mo and Ta are all 2000° C. or more, and are less likely to form a compound with Ce. Thus, at a relatively low temperature around the melting point of Ce, no chemical reaction is caused between them. For that reason, these are very stable materials for the part carrying metal Ce 41 directly thereon.

Next, it will be described how to deposit a film by the MBE process according to this embodiment. In the first embodiment, metal Ce is stored in the K-cell, heated and then supplied onto the substrate as a so-called "molecular beam". The fourth embodiment is characterized by using the EB heating unit 48 instead of the K-cell. Specifically, by irradiating the metal Ce 41 carried in the mechanism 49 of the EB heating unit 48 with an electron beam accelerated with the application of a voltage between 5 and 30 keV, the metal Ce 41 can be heated, vaporized and supplied onto the substrate 14 as the "molecular beam". Suppose part or all of metal Ce 41 has been oxidized for some reason and changed into cerium oxide ($CeO_x$, where x=1 to 2) with a high melting point. Even if so much part of the metal Ce 41 has changed into cerium oxide with a high melting point that sufficient molecular beam cannot be obtained from the K-cell, that cerium oxide part can be easily fused and vaporized by being heated with the electron beam. Thus, it is also possible to supply Ce in a so-called molecular beam state onto the substrate 14.

Subsequently, the substrate 14 should be cleaned and loaded into the vacuum vessel 13 to form a $CeO_2$ film thereon. These process steps are performed as already described for the first embodiment.

The Ce molecular beam to be supplied, as well as the acceleration rate of the electron beam used for heating, is controllable by operating the shutter 46. In this manner, an excellently crystalline $CeO_2(001)$ film can be formed on an Si(001) substrate by alternately stacking multiple Ce and O layers thereon in the MEE mode as in the first embodiment.

Embodiment 5

Hereinafter, a fifth embodiment of the present invention relating to a method and system for forming a dielectric film will be described with reference to the drawings.

Figure 8:
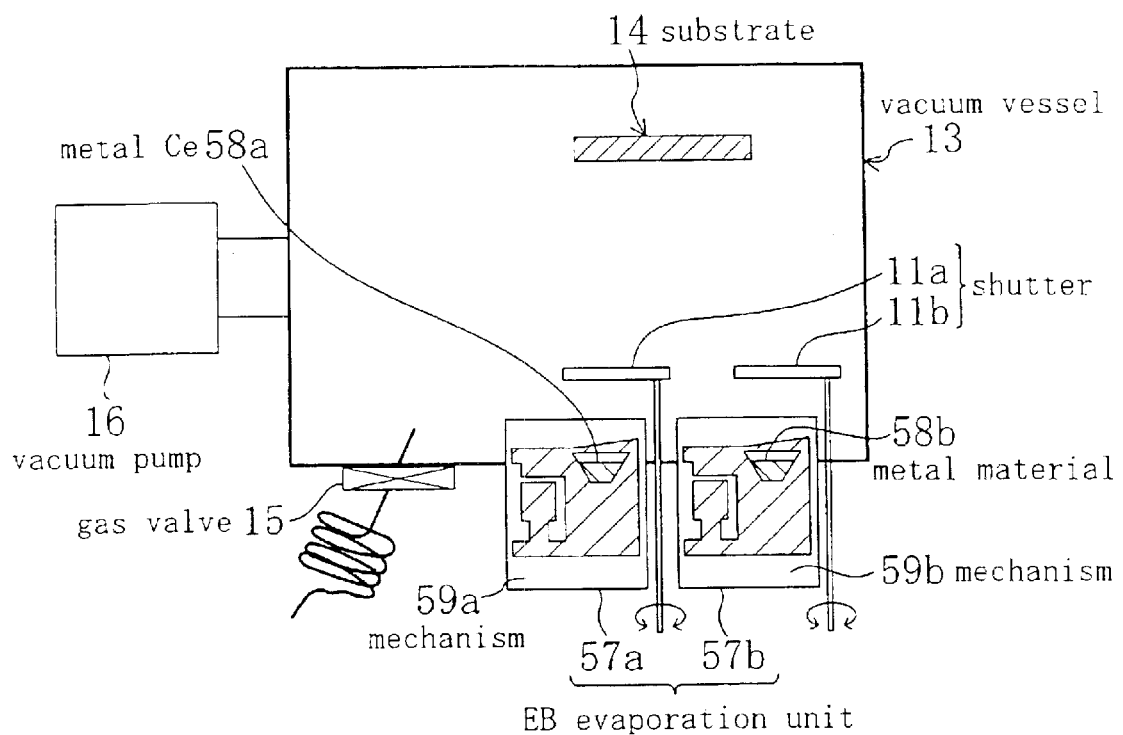
FIG. 8 is a cross-sectional view schematically illustrating an arrangement of an MBE system used in fifth through tenth embodiments of the present invention.

FIG. 8 is a cross-sectional view schematically illustrating an arrangement of an MBE system used in the fifth through tenth embodiments of the present invention. As shown in FIG. 8, the MBE system includes: a vacuum vessel 13 in which MBE growth or deposition is produced; a vacuum pump 16 for reducing the pressure inside the vacuum vessel 13; first and second EB evaporation units 57a and 57b for forming a thin film of $CeO_2$, for example; shutters 11a and 11b for controlling the amount of Ce supplied into the vacuum vessel 13; and a gas valve 15 for controlling the flow rate of oxygen gas supplied into the vacuum vessel 13. The system is so constructed as to produce MBE growth or deposition with a substrate 14, which is an object to be processed, placed on a sample stage (not shown). The first EB evaporation unit 57a includes a mechanism 59a for carrying metal Ce 58a therein and heating the metal Ce 58a by irradiating it with an electron beam (EB). The second EB evaporation unit 57b includes a mechanism 59b for carrying a metal material 58b other than metal Ce (e.g., Mg, Bi, Zr, Y or La) therein and heating the metal material 59b by irradiating it with an electron beam. These EB evaporation units 57a and 57b are so constructed as to supply Ce and a metal material as so-called molecular beams by operating the shutters 11a and 11b, respectively.

A part of the mechanism 59a in the first EB evaporation unit 57a for directly carrying the metal Ce 58a thereon is preferably made of tungsten (W), molybdenum (Mo) or tantalum (Ta), not carbon (C) or copper (Cu) usually used for an EB unit. The reason is as follows. The melting point of Cu is around 1000° C., which is only 100 to 200° C. higher than that of Ce. Thus, while Ce is being fused and vaporized, Cu might also be fused and vaporized at the same time. Also, although the melting point of carbon is as high as around 3000° C., carbon easily forms a compound with Ce. Thus, a chemical reaction might be caused between carbon and Ce at 1000° C. or less to form a carbide and destroy the mechanism 59a. In contrast, the melting points of W, Mo and Ta are all 2000° C. or more, and are less likely to form a compound with Ce. Thus, at a relatively low temperature around the melting point of Ce, no chemical reaction is caused between them. For that reason, these are very stable materials for the part carrying metal Ce 58a directly thereon. The same statement is applicable to a part of the mechanism 59b in the second EB evaporation unit 57b for directly carrying the metal material 58b thereon.

And the system is constructed to supply the metal material and Ce as so-called "molecular beams" by controlling the opened/closed states of the shutters 11a and 11b, respectively. Also, by controlling the gas valve 15, which is provided along with the EB evaporation units 57a and 57b for the vacuum vessel 13, oxygen can be supplied into the vacuum vessel 13 continuously and separately from the metal Ce 58a and the metal, material 58b. In addition, the flow rate of oxygen can also be controlled such that oxygen is supplied regularly for just a short period of time by pulse flow. That is to say, the gas valve 15 is provided with a solenoid valve, which can be opened or closed within 0.1 second. Moreover, when the solenoid valve is closed, the leakage rate thereof can be suppressed to $1 \times 10^{-5}$ cc/sec. or less.

In the illustrated embodiment, the EB evaporation units are used for supplying the metal Ce 58a and metal material 58b. However, if Mg or Bi, which can ensure a sufficient vapor pressure even at a low temperature, is used, Knudsen cells (K-cells) may be used instead of the EB evaporation units.

In the foregoing embodiment, the EB evaporation units are used for supplying the metal Ce 58a and the metal material 58b. As for Mg and Bi that ensure a sufficiently high vapor pressure even at a low temperature, however, the EB evaporation units may be replaced with Knudsen cells (K-cells).

Next, it will be described how to perform the MBE process. The inside of the MBE system is always evacuated by the vacuum pump 16. By performing this operation, impurities contained in the metal Ce and the metal material and contaminants existent around their surfaces or adhered to the EB evaporation units 57a and 57b can be vaporized. Accordingly, in actually forming a dielectric film, Ce atoms can be supplied into the vacuum vessel 13 using high-purity metal Ce and other metal material, from which most of impurities and contaminants has been removed. As a result, an excellently crystalline $CeO_2$ thin film can be formed as will be described later.

On the other hand, the substrate 14 to be processed is prepared in the following manner. The substrate 14, which is an Si substrate with a LOCOS film and so on formed thereon, is cleaned, dipped in a solution containing hydrogen fluoride (HF) or ammonium fluoride ($NH_4F$), rinsed with water, dried and then loaded into the MBE system immediately for crystal growth purposes. At this time, the surface of the substrate 14 is covered with hydrogen (H) atoms or a very thin $SiO_2$ amorphous layer as a result of these operations. In this embodiment, the principal surface of the Si substrate 17 is a (001) plane. Alternatively, the principal surface of the Si substrate may be a (111) plane, a plane with any other higher-order index or an off-axis plane tilted from any of these planes by several degrees. And when the substrate 14 is heated up to a temperature between 100 and 400° C. within the MBE system, water and adsorbed gases remaining on the surface of the substrate 14 are removed. Thereafter, the substrate 14 is further heated to, and kept at, a temperature between 800 and 900° C. At this time, the H atoms and the thin $SiO_2$ amorphous layer, which have covered the surface of the substrate 14, are also desorbed. As a result, a clean and smooth surface of the substrate 14 is exposed inside the vacuum vessel 13.

Figure 9A:
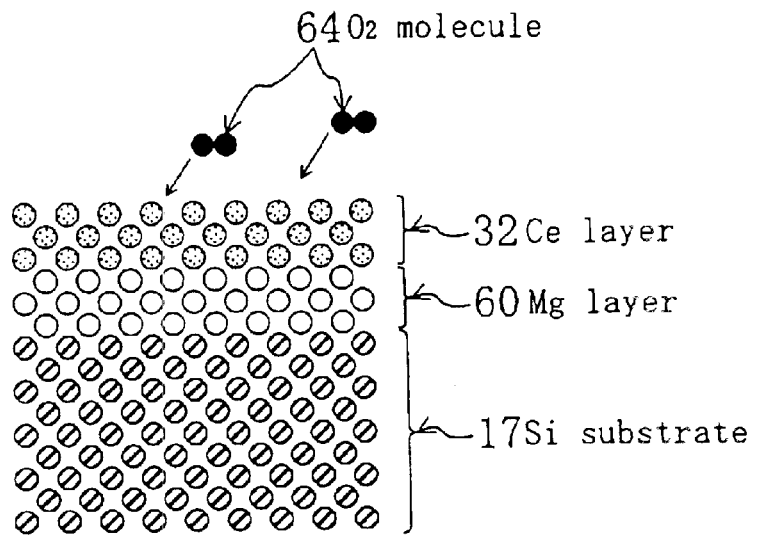
FIGS. 9(a) through 9(c) illustrate a process through which a $CeO_2$ film is formed by stacking and then oxidizing Mg and Ce that are metal materials used in the fifth embodiment.
Figure 9B:
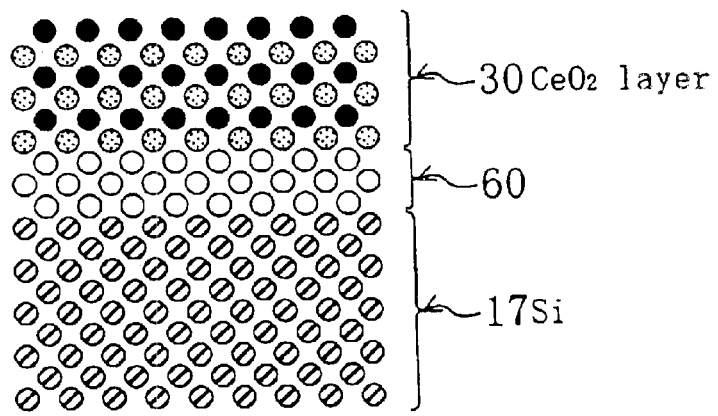
Figure 9C:
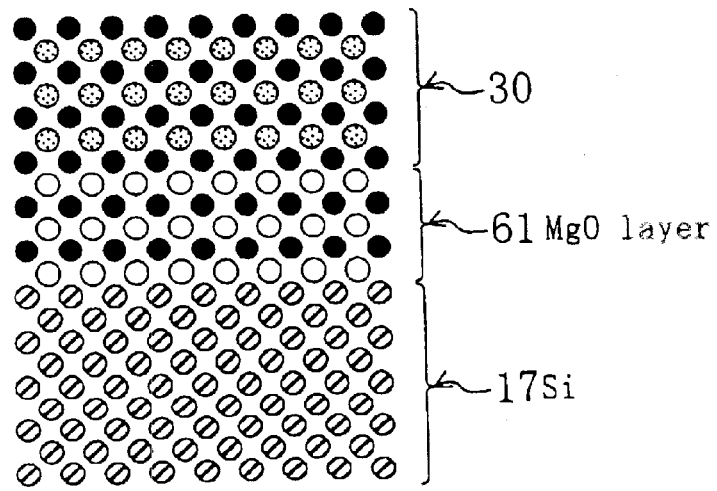

FIGS. 9(a) through 9(c) illustrate a process, through which a $CeO_2$ film is formed by stacking Mg, i.e., a metal material used in this embodiment, and Ce on an Si substrate and then oxidizing them.

When the metal material (Mg in this case) and Ce are supplied into the vacuum vessel 13 by operating the second and first EB evaporation units 57b and 57a shown in FIG. 8 in this order, a single crystal Mg layer 60 and a single crystal Ce layer 32 are formed successively on the Si substrate 17 as shown in FIG. 9(a). The Mg and Ce layers 60 and 32 should be thin enough to relay the information about the crystal lattice of the Si substrate 17 upward. Specifically, the thickness of the Mg and Ce layers 60 and 32 is preferably 5 Å (equivalent to that of four atomic layers) or less.

Thereafter, when the gas valve 15 shown in FIG. 8 is opened, $O_2$ molecules 64 are supplied onto the Ce layer 32. At first, these $O_2$ molecules (or atoms) 64 penetrate into, and diffuse inside, the Ce layer 32. As a result, Ce contained in the Ce layer 32 is oxidized to form a $CeO_2$ layer 30 as shown in FIG. 9(b). In this case, the amount of $O_2$ molecules 64 supplied may be controlled such that the deeper Mg layer 60 is not oxidized with those $O_2$ molecules 64 but that only the $CeO_2$ layer 30 is formed as shown in FIG. 9(b).

In an actual process, however, oxygen is usually supplied excessively to prevent oxygen from being desorbed out of the $CeO_2$ layer 30. Also, the resultant $CeO_2$ layer 30 is very likely to transmit those $O_2$ molecules 64 by nature. As a result, Mg contained in the Mg layer 60, which is located just under the $CeO_2$ layer 30, is also oxidized to form an MgO layer 61 as shown in FIG. 9(c). In general, Mg shows higher affinity for oxygen compared to Si, but is less likely to transmit oxygen. Thus, it is almost impossible for oxygen to reach so far as the surface of the Si substrate 17. In other words, there is almost no concern about the formation of $SiO_2$ as a result of oxidation of the Si substrate 17 at the surface.

In accordance with the method of this embodiment, the Mg and Ce layers 60 and 32 with a crystal structure analogous to that of the Si substrate 17 are formed first, and then the $CeO_2$ layer 30 is formed by supplying the $O_2$ molecules 64 thereto. Thus, the $CeO_2$ layer 30 also has a crystal structure similar to that of the Si substrate 17. Since an Si(001) substrate is used as the Si substrate 17 according to this embodiment, a $CeO_2$(001) layer 30 with excellent crystallinity can be formed. As already described, if epitaxial growth is produced as in the conventional fabrication process under such conditions that $O_2$ molecules and Ce atoms are supplied at a time, then $CeO_2$ crystals growing are more likely to form (011) planes. However, if the Ce layer 32 has been formed in advance to follow the crystal structure of the Si(001) substrate as is done in this embodiment, no $CeO_2$ (011) film, in which Ce and O atoms coexist in a common lattice plane as shown in FIG. 19, is formed even if Ce contained in the Ce layer 32 is oxidized after that. That is to say, a double-domain-free, excellently crystalline $CeO_2$ (001) film can be formed easily as the $CeO_2$ layer 30 according to this embodiment. Consequently, the resultant $CeO_2$ layer not only has a dielectric constant high enough (i.e., about 63) to be applicable as either a gate insulating film for an MIS device or a buffer layer for a ferroelectric layer in an FeRAM but also exhibits excellent crystallinity.

In addition, the Mg layer 60, which does not transmit oxygen easily, is formed as an underlying metal layer for the Ce layer 32. Thus, it is possible to prevent an $SiO_2$ layer with a low dielectric constant (of about 3.9) from being formed as a result of oxidation of the Si substrate 17. Consequently, the resultant MgO layer not only has a dielectric constant high enough (i.e., about 9.7) to be applicable as either a gate insulating film for an MIS device or a buffer layer for a ferroelectric layer in an FeRAM but also exhibits excellent crystallinity.

In the foregoing exemplary embodiment, an Si(001) substrate is used as the Si substrate 17 and the $CeO_2$ layer 30 is formed as a $CeO_2$(001) film over the Si substrate 17. Alternatively, an Si(111) substrate may be used as the Si substrate 17. In such a case, a $CeO_2$(111) film is formed over the Si(111) substrate.

Embodiment 6

Next, a sixth embodiment of the present invention will be described. As in the fifth embodiment, the fabrication system shown in FIG. 8 is used according to this embodiment, too. Also, in this embodiment, Knudsen cells (K-cells) may be used as units for supplying metal Ce and a metal material instead of the EB evaporation units 57a and 57b shown in FIG. 8 as mentioned for the sixth embodiment.

Next, it will be described how to form a $CeO_2$ film according to this embodiment. The Si substrate is prepared prior to the MBE growth as already described for the fifth embodiment.

Figure 10A:
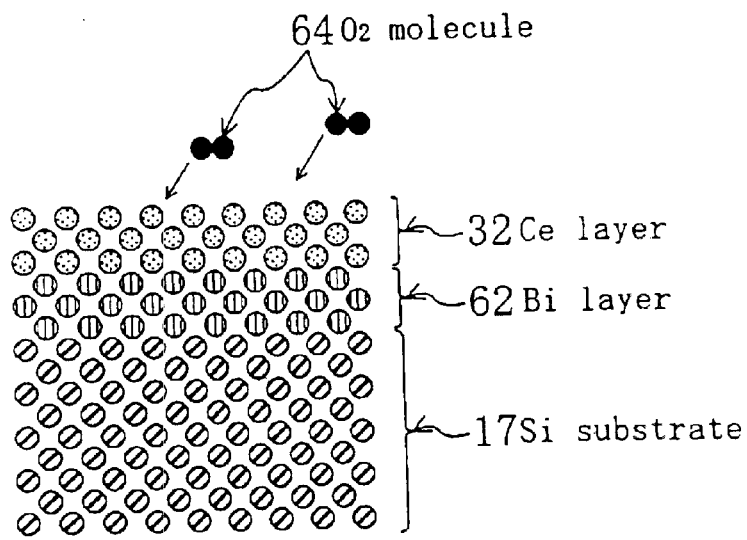
FIGS. 10(a) through 10(c) illustrate a process through which a $CeO_2$ film is formed by stacking and then oxidizing Bi and Ce that are metal materials used in the sixth embodiment.
Figure 10B:
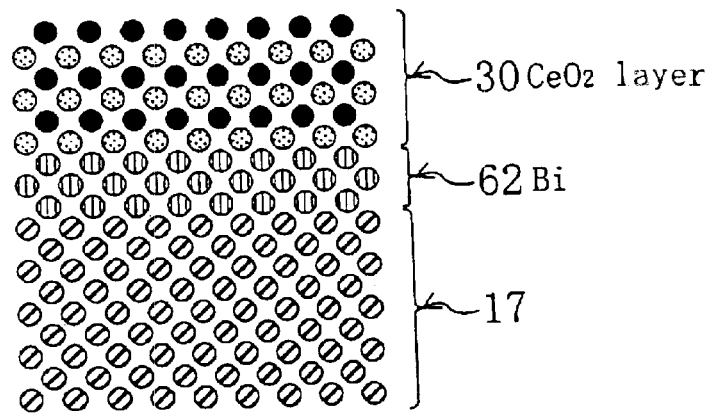
Figure 10C:
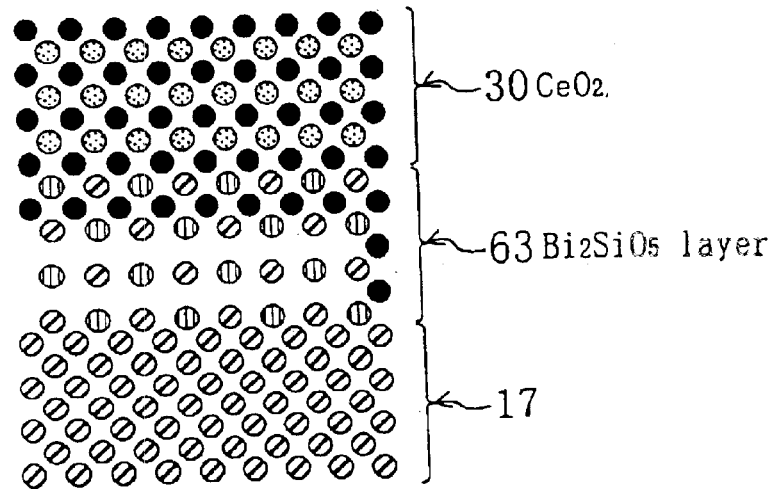

FIGS. 10(a) through 10(c) illustrate a process through which a $CeO_2$ film is formed by stacking Bi, i.e., a metal material used in this embodiment, and Ce on an Si substrate and then oxidizing them.

When the metal material (Bi in this case) and Ce are supplied into the vacuum vessel 13 by operating the second and first EB evaporation units 57b and 57a shown in FIG. 8 in this order, a single crystal Bi layer 62 and a single crystal Ce layer 32 are formed successively on the Si substrate 17 as shown in FIG. 10(a). The Bi and Ce layers 62 and 32 should be thin enough to relay the information about the crystal lattice of the Si substrate 17 upward. Specifically, the thickness of the Bi and Ce layers 62 and 32 is preferably 5 Å (equivalent to that of four atomic layers) or less.

Thereafter, when the gas valve 15 shown in FIG. 8 is opened, $O_2$ molecules 64 are supplied onto the Ce layer 32. At first, these $O_2$ molecules (or atoms) 64 penetrate into, and diffuse inside, the Ce layer 32. As a result, Ce contained in the Ce layer 32 is oxidized to form a $CeO_2$ layer 30 as shown in FIG. 10(b). In this case, the amount of $O_2$ molecules 64 supplied may be controlled such that the deeper Bi layer 62 is not oxidized with the $O_2$ molecules 64 but that only the $CeO_2$ layer 30 is formed as shown in FIG. 10(b).

In an actual process, however, oxygen is usually supplied excessively to prevent oxygen from being desorbed out of the $CeO_2$ layer 30. Also, the resultant $CeO_2$ layer 30 is very likely to transmit those $O_2$ molecules 64 by nature. As a result, part or all of Bi contained in the Bi layer 62, which is located just under the $CeO_2$ layer 30, is also oxidized. At this time, Bi may be oxidized in one of the following two manners.

In one case, Bi reacts with oxygen only to form $Bi_2O_3$. In general, Bi shows higher affinity for oxygen compared to Si, and is less likely to transmit oxygen. Thus, it is almost impossible for oxygen to reach so far as the surface of the Si substrate 17. In other words, there is almost no concern about the formation of $SiO_2$ as a result of oxidation of the Si substrate 17 at the surface.

The other possibility is that Bi reacts with both oxygen (O) and Si. In such a case, a $Bi_2SiO_5$ layer 63, which is made up of crystals of a silicate compound, i.e., $Bi_2SiO_5$, is formed as shown in FIG. 10(c). Unlike $SiO_2$, $Bi_2SiO_5$ easily forms a crystal structure with excellent crystallinity on the Si substrate 17. The crystal structure of $Bi_2SiO_5$ is cubic, which is the same as the structure of Si single crystals having a diamond cubic structure. In addition, since oxygen is supplied after the Bi and Ce layers have been once formed, the $Bi_2SiO_5$ crystals also grow in the uppermost part of the surface of the Si substrate while oxygen is diffusing inside the thin Bi layer. In other words, the formation of the $Bi_2SiO_5$ layer 63 is also a result of downward growth. We can say no $SiO_2$ is formed in this case. Furthermore, since the Bi layer 62 reacts with the Si substrate 17 at their interface when the Bi layer 62 is formed, dangling bonds that existed in the interface are terminated. Thus, the density of interface states can be reduced to $3\times10^{10}$ $cm^{-2}$ or less.

The Bi layer 62 may be oxidized selectively in one of these two manners by controlling deposition conditions thereof. The deposition conditions mainly refer to substrate temperature and flow rate of oxygen.

In accordance with the method of this embodiment, the Bi and Ce layers 62 and 32 with a crystal structure analogous to that of the Si substrate 17 are formed first, and then the $CeO_2$ layer 30 is formed by supplying the $O_2$ molecules 64 thereto. Thus, the $CeO_2$ layer 30 also has a crystal structure similar to that of the Si substrate 17. Since an Si(001) substrate is used as the Si substrate 17 according to this embodiment, a $CeO_2$(001) layer 30 with excellent crystallinity can be formed. As already described, if epitaxial growth is produced as in the conventional fabrication process under such conditions that $O_2$ molecules and Ce atoms are supplied at a time, then $CeO_2$ crystals growing are more likely to form (011) planes. However, if the Ce layer 32 has been formed in advance to follow the crystal structure of the si(001) substrate as is done in this embodiment, no $CeO_2$ (011) film, in which Ce and O atoms coexist in a common lattice plane as shown in FIG. 19, is formed even if Ce contained in the Ce layer 32 is oxidized after that. That is to say, a double-domain-free, excellently crystalline $CeO_2$ (001) film can be formed easily as the $CeO_2$ layer 30 according to this embodiment. Consequently, the resultant $CeO_2$ layer not only has a dielectric constant high enough (i.e., about 63) to be applicable as either a gate insulating film for an MIS device or a buffer layer for a ferroelectric layer in an FeRAM but also exhibits excellent crystallinity.

In addition, the Bi layer 62, which does not transmit oxygen easily, is formed as an underlying metal layer for the Ce layer 32. Thus, it is possible to prevent an $SiO_2$ layer from being formed as a result of oxidation of the Si substrate 17. Consequently, the resultant $BiO_2$ or $Bi_2SiO_5$ layer not only has a dielectric constant high enough to be applicable as either a gate insulating film for an MIS device or a buffer layer for a ferroelectric layer in an FeRAM but also exhibits excellent crystallinity.

In particular, the $Bi_2SiO_5$ layer 63, formed as a result of oxidation of the latter type, is made of cubic crystals with the same crystal structure as that of Si single crystals with a diamond cubic structure and shows good affinity for the Si substrate 17. Thus, the crystallinity and dielectric properties of the $CeO_2$ layer 32 to be formed thereon will be excellent. In addition, a $ZrO_2$ layer with a dielectric constant high enough to be applicable as a buffer layer for a ferroelectric layer and with excellent crystallinity can be obtained.

In the foregoing exemplary embodiment, an Si(001) substrate is used as the Si substrate 17 and the $CeO_2$ layer 30 is formed as a $CeO_2$(001) film over the Si substrate 17. Alternatively, an Si(111) substrate may be used as the Si substrate 17. In such a case, a $CeO_2$(111) film is formed over the Si(111) substrate.

It should be noted that the $Bi_2SiO_5$ layer may also be used as a ferroelectric layer because the $Bi_2SiO_5$ layer exhibits ferroelectricity.

Embodiment 7

Next, a seventh embodiment of the present invention will be described. As in the fifth embodiment, the fabrication system shown in FIG. 8 is used according to this embodiment, too. Also, in this embodiment, Knudsen cells (K-cells) may be used as units for supplying metal Ce and a metal material instead of the EB evaporation units 57a and 57b shown in FIG. 8 as mentioned for the fifth embodiment.

Next, it will be described how to form a $CeO_2$ film according to this embodiment. The Si substrate is prepared prior to the MBE growth as already described for the fifth embodiment.

FIGS. 11(a) through 11(d) illustrate a process, through which a $CeO_2$ film is formed by stacking Zr, i.e., a metal material used in this embodiment, and Ce on an Si substrate and then oxidizing them.

Figure 11A:
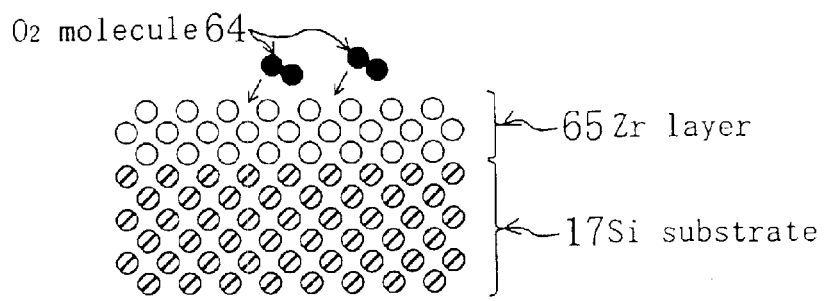
FIGS. 11(a) through 11(d) illustrate a process through which a $CeO_2$ film is formed by stacking and then oxidizing Zr and Ce that are metal materials used in the seventh embodiment.

When the metal material (Zr in this case) is supplied into the vacuum vessel 13 by operating the second EB evaporation unit 57b shown in FIG. 8, a Zr layer 65 is formed on the Si substrate 17 as shown in FIG. 11(a). The Zr layer 65 should be thin enough to relay the information about the crystal lattice of the Si substrate 17 upward. Specifically, the thickness of the Zr layer 65 is preferably 30 Å (equivalent to that of twenty-four atomic layers) or less, more preferably 5 Å (equivalent to that of four atomic layers) or less.

Thereafter, when the gas valve 15 shown in FIG. 8 is opened, $O_2$ molecules 64 are supplied onto the Ce layer 32. These $O_2$ molecules (or atoms) 64 penetrate into, and diffuse inside, the Zr layer 65. As a result, Ce contained in the Zr layer 65 is oxidized to form a $ZrO_2$ layer 66.

Figure 11B:
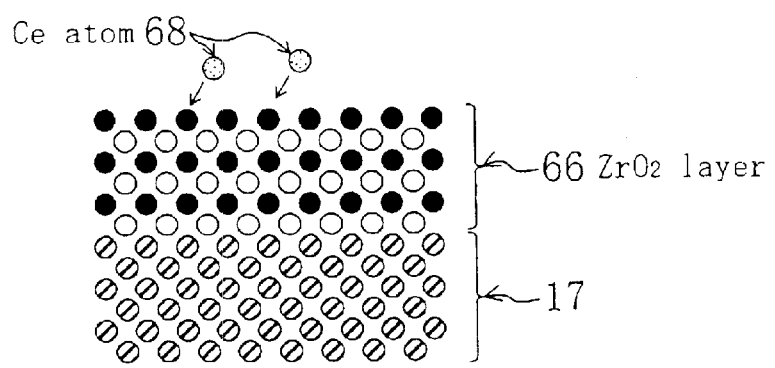
Figure 11C:
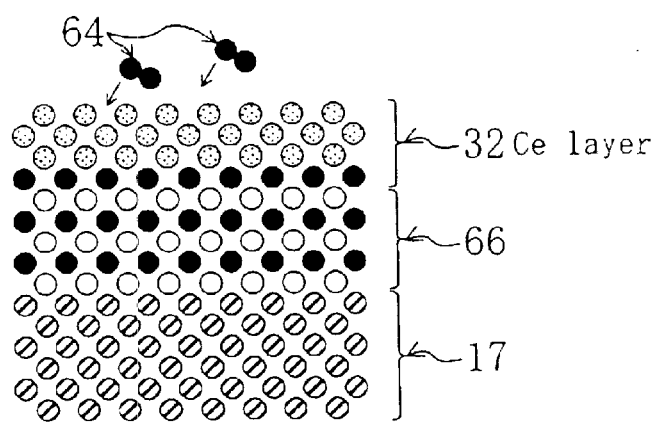

Subsequently, when the first EB evaporation unit 57a shown in FIG. 8 is operated, Ce atoms 68 are supplied onto the $ZrO_2$ layer 66 as shown in FIG. 11(b). As a result, a single crystal Ce layer 32 is formed on the $ZrO_2$ layer 66 as shown in FIG. 11(c). The Ce layer 32 should be thin enough to relay the information about the crystal lattice of the Si substrate 17 upward. Specifically, the thickness of the Ce layer 32 is preferably 30 Å (equivalent to that of twenty-four atomic layers or less, more preferably 5 Å (equivalent to that of four atomic layers) or less.

Figure 11D:
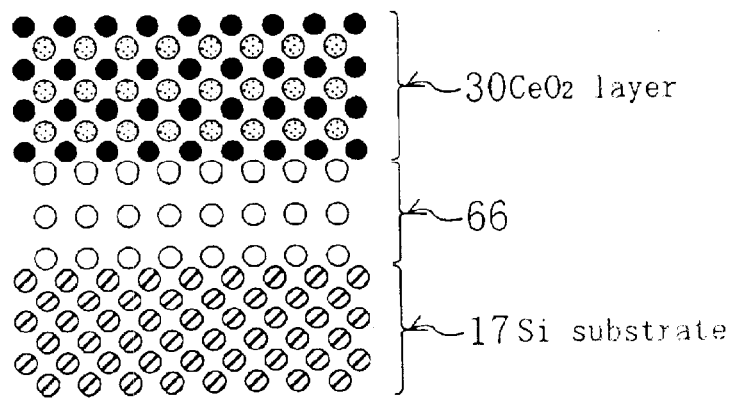

Thereafter, when the gas valve 15 shown in FIG. 8 is opened, $O_2$ molecules 64 are supplied onto the Ce layer 32. These $O_2$ molecules 64 penetrate into, and diffuse inside, the Ce layer 32. As a result, Ce contained in the Ce layer 32 is oxidized to form a $CeO_2$ layer 30 as shown in FIG. 11(d).

According to the method of this embodiment, the Zr layer 65 is formed first such that its atoms are arranged at respective sites following the crystal structure of the Si substrate 17 and then the $ZrO_2$ layer 66 is formed by supplying $O_2$ molecules 64 thereto. These $ZrO_2$ crystals have a fluorite-type crystal structure and form a lattice substantially continuously with the diamond cubic crystals of the Si single crystals as described above. In addition, since the Zr layer 65 is formed first and then the $ZrO_2$ layer 66 is formed by supplying the $O_2$ molecules 64 thereto, the $ZrO_2$ layer 66 substantially lattice-matches the crystals of the Si substrate 17. Since an Si(001) substrate is used as the Si substrate 17 according to this embodiment, a $ZrO_2(001)$ layer 66 with excellent crystallinity can be formed. As already described, if epitaxial growth is produced as in the conventional fabrication process under such conditions that $O_2$ molecules and Ce atoms are supplied at a time, then $CeO_2$ crystals growing are more likely to form (011) planes. The same statement is applicable to forming a $ZrO_2$ layer with the same fluorite-type crystal structure as the $CeO_2$ layer. However, if the Zr layer 65 has been formed in advance to follow the crystal structure of the Si(001) substrate as is done in this embodiment, no $ZrO_2(011)$ layer with double domains such as the $CeO_2$ crystals shown in FIG. 19 is formed even if Ce contained in the Zr layer 65 is oxidized after that. That is to say, a double-domain-free, excellently crystalline $ZrO_2(001)$ film can be formed easily as the $ZrO_2$ layer 66 according to this embodiment. Consequently, the resultant $ZrO_2$ layer not only has a dielectric constant high enough (i.e., about 12.5) to be applicable as either a gate insulating film for an MIS device or a buffer layer for a ferroelectric layer in an FeRAM but also shows excellent crystallinity.

And the Ce layer 32 is formed thereon and then turned into the $CeO_2$ layer 30. Accordingly, an excellently crystalline $CeO_2(001)$ film can be formed easily as the $CeO_2$ layer 30 without using metal Ce, which is a material hard to handle. That is to say, the resultant $CeO_2$ layer not only has a dielectric constant high enough (i.e., about 63) to be applicable as either a gate insulating film for an MIS device or a buffer layer for a ferroelectric layer in an FeRAM but also shows excellent crystallinity.

In addition, since the Zr layer 65 does not transmit oxygen easily, it is possible to prevent an $SiO_2$ layer from being formed due to oxidation of the Si substrate 17.

In the foregoing exemplary embodiment, an Si(001) substrate is used as the Si substrate 17 and the $CeO_2$ layer 30 is formed as a $CeO_2(001)$ film over the Si substrate 17. Alternatively, an Si(111) substrate may be used as the Si substrate 17. In such a case, a $CeO_2(111)$ film is formed over the Si(111) substrate.

Modified Examples of Embodiments 5 Through 7

In the fifth through seventh embodiments, the Ce and O layers do not have to be stacked alternately in forming the $CeO_2$ layer. Alternatively, Ce and $O_2$ may be supplied at the same time.

Also, Y (yttrium), as well as Mg, Bi, Zr or La, may be used as a metal material for the underlying layer between the Si substrate 17 and the $CeO_2$ layer 30. In such a case, a Y or $Y_2O_3$ layer may be formed instead of an MgO, $Bi_2O_3$, $ZrO_2$, $Y_2O_3$ or $La_2O_3$ layer containing an oxide of the metal.

Furthermore, the underlying layer may be a multilayer structure including, in combination, Mg, Bi, Zr, Y or La layer and MgO, $Bi_2O_3$, $ZrO_2$, $Y_2O_3$ or $La_2O_3$ layer containing its oxide.

Embodiment 8

Next, an eighth embodiment of the present invention will be described. In this and the following embodiments, a structure, in which a ferroelectric layer is formed on a dielectric layer with a high dielectric constant, will be described by way of example.

As in the fifth embodiment, the fabrication system shown in FIG. 8 is used according to this embodiment, too. Also, in this embodiment, Knudsen cells (K-cells) may be used as units for supplying metal Ce and metal materials for the ferroelectric film instead of the EB evaporation units 57a and 57b shown in FIG. 8 as mentioned for the fifth embodiment. In any case, the EB evaporation units 57b or Knudsen cells for forming a ferroelectric film should be provided for the same number of types of metal materials for forming the ferroelectric film.

According to this embodiment, the Si substrate is also prepared prior to the MBE growth as already described for the fifth embodiment.

Figure 12A:
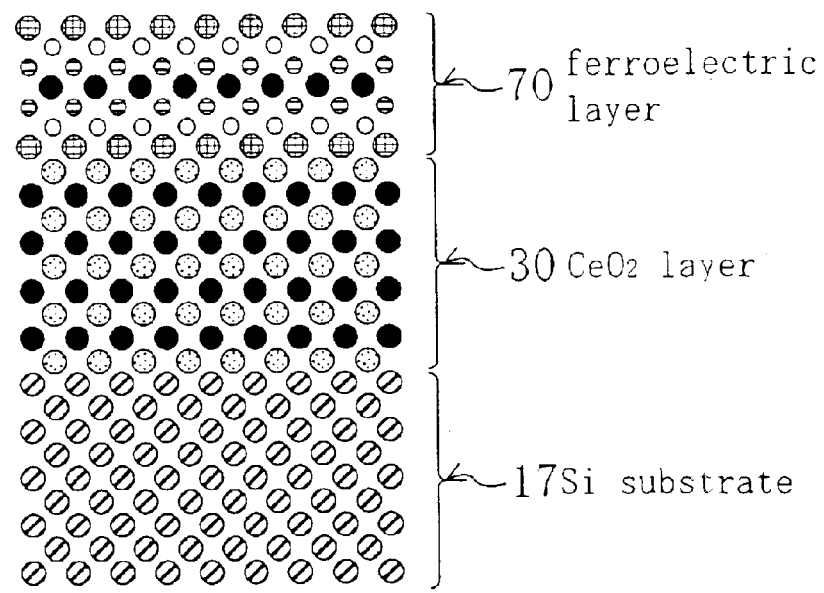
FIGS. 12(a) and 12(b) illustrate two exemplary structures in which a ferroelectric layer is formed on a $CeO_2$ layer according to the eighth embodiment.
Figure 12B:
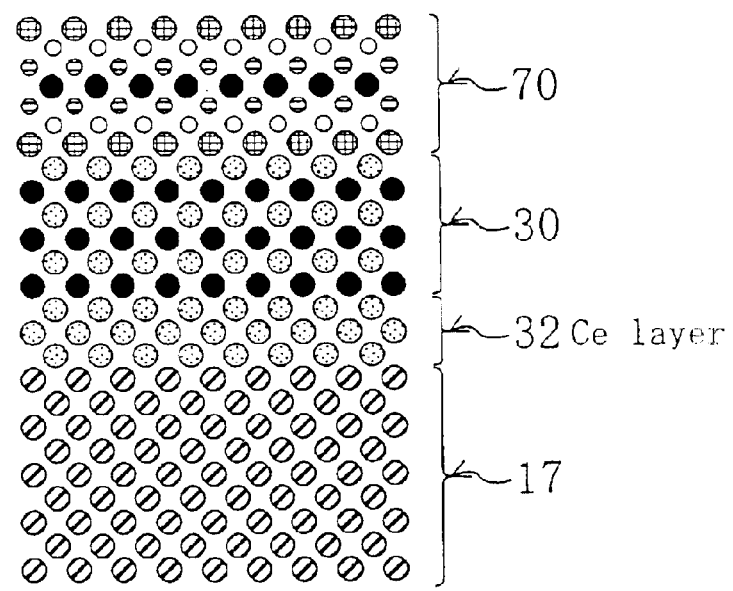

FIGS. 12(a) and 12(b) illustrate two exemplary structures in which a ferroelectric layer is formed on a $CeO_2$ layer according to the eighth embodiment.

In the structure shown in FIG. 12(a), a $CeO_2$ layer 30, which is a buffer layer made of a dielectric with a high dielectric constant, and a ferroelectric layer 70 are formed on a clean and smooth surface of the Si substrate 17. The ferroelectric layer 70 may be made of $PbLaTiO_x$ (i.e., so-called PLT) or $PbZrTiO_x$ (i.e., so-called PZT), for example, but may be any other ferroelectric film with crystallinity. In the structure shown in FIG. 12(a), the $CeO_2$ layer 30 with excellent crystallinity is formed as a buffer layer for the ferroelectric layer 70 by the method of the first, second, third or fourth embodiment, for instance. Accordingly, the ferroelectric layer 70 also exhibits excellent crystallinity or orientations. However, the ferroelectric layer 70 made of PLT or PZT does not always have the same crystal structure as the $CeO_2$ layer 30, and has a different lattice constant from that of the $CeO_2$ layer 30. Thus, the atoms of the ferroelectric and $CeO_2$ layers 70 and 30 do not form perfect bonds in the interface therebetween. That is to say, the ferroelectric layer 70 does not always have a single crystal structure over a broad range. But the ferroelectric layer 70 shows good orientations by being affected by the crystal structure of the $CeO_2$ layer 30. Specifically, particular crystal axes (e.g., c-axis) thereof are oriented vertically to the surface of the substrate over the entire ferroelectric layer 70. The ferroelectric layer 70 is in a polycrystalline state, in which several domains separately exist with the directions of crystal axes slightly deviated from each other. However, if the direction in which particularly high ferroelectricity is exhibited (i.e., the direction in which residual polarization is attained) is vertical to the surface of the substrate or aligned in a direction defined by a certain angle, then the ferroelectric layer 70 ensures high residual polarization or can exhibit uniform ferroelectric properties.

On the other hand, FIG. 12(b) illustrates a structure in which a Ce layer 32 is interposed between the $CeO_2$ layer 30 and the Si substrate 17. Such a structure is formed either by depositing several atomic layers of Ce (e.g., three atomic layers in the example illustrated in FIG. 12(b)) first and then supplying oxygen and Ce alternately or by partially oxidizing the Ce layer 32 deposited in advance. Even so, or if a device like a semiconductor memory is formed using this substrate, the electrical and mechanical characteristics of the device are not adversely affected by the Ce layer 32.

According to the eighth embodiment, the $CeO_2$ layer is formed by any of the methods of the first through seventh embodiments. Specifically, after one atomic layer of Ce is deposited on the Si substrate using metal Ce, an atomic layer of oxygen is deposited thereon. In this manner, monatomic layers are alternately stacked in the MEE mode, thereby forming an excellently crystalline, double-domain-free $CeO_2$(001) layer on an Si(001) substrate, for example. Alternatively, several atomic layers of Ce may be formed by supplying only metal Ce first, and then the $CeO_2$ layer may be formed by supplying oxygen. Furthermore, oxygen may also be supplied when required for forming a ferroelectric film as will be described for the tenth embodiment. That is to say, the Ce layer may be turned into the $CeO_2$ layer by forming the ferroelectric layer on the Ce layer. Since Ce easily transmits oxygen, the latter technique is effectively applicable.

Also, according to this embodiment, the ferroelectric layer 70 can be formed easily by the well-known technique of forming a ferroelectric film using the MBE process. Thus, the description of the forming method will be omitted herein.

In the dielectric film including the ferroelectric layer 70 according to this embodiment, the ferroelectric layer 70 is formed on the $CeO_2$ layer 30, which functions as a buffer layer with a high dielectric constant. Accordingly, even if the buffer layer is thick, capacitance per unit area can be kept high. That is to say, the generation of leakage current, which usually results from a thin buffer layer, for example, can be suppressed effectively. In addition, the excellently crystalline $CeO_2$ layer 30 is formed first and then the ferroelectric layer 70 is formed on that $CeO_2$ layer 30. Thus, the resultant ferroelectric layer 70 shows good orientations, high residual polarization or much less varied ferroelectric properties.

In this case, almost no $SiO_2$ layer with a low dielectric constant is formed. Accordingly, where an electrode is provided over the ferroelectric layer and a voltage is applied between the electrode and the substrate, it is possible to avoid an unfavorable situation where the voltage is mostly applied to the $SiO_2$ layer with a low dielectric constant and just a fraction of the voltage is actually applied to the ferroelectric layer.

Embodiment 9

Next, a ninth embodiment of the present invention will be described. As in the fifth embodiment, the fabrication system shown in FIG. 8 is used according to this embodiment, too. Also, in this embodiment, Knudsen cells (K-cells) may be used as units for supplying metal Ce and metal materials for the ferroelectric film instead of the EB evaporation units 57a and 57b shown in FIG. 8 as mentioned for the fifth embodiment. In any case, the EB evaporation units 57b or Knudsen cells for forming the ferroelectric film should be provided for the same number of types of metal materials for forming the ferroelectric film.

According to this embodiment, the Si substrate is also prepared prior to the MBE growth as already described for the fifth embodiment.

Figure 13A:
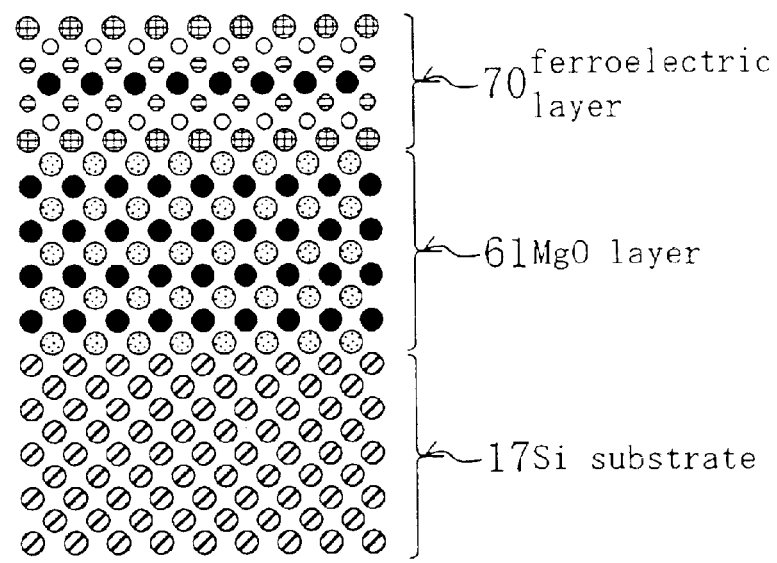
FIGS. 13(a) and 13(b) illustrate two exemplary structures in which a ferroelectric layer is formed on an MgO layer according to the ninth embodiment.
Figure 13B:
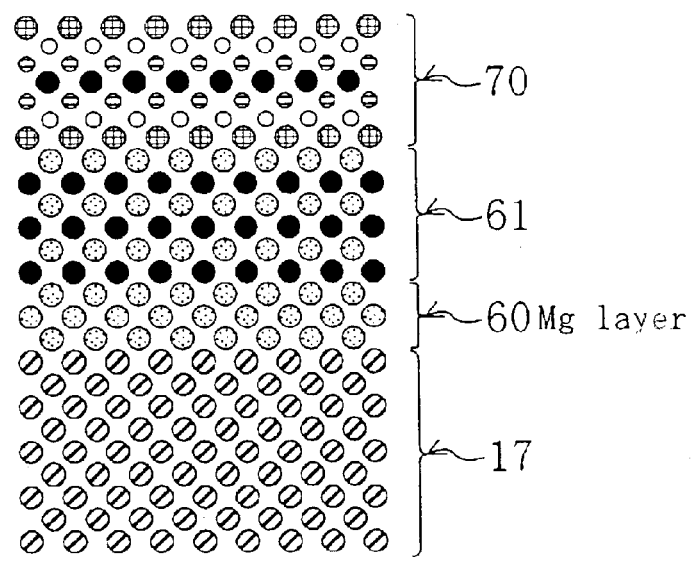

FIGS. 13(a) and 13(b) illustrate two exemplary structures in which a ferroelectric layer is formed on an MgO layer according to the ninth embodiment.

In the structure shown in FIG. 13(a), an MgO layer 61, which is a buffer layer made of a dielectric with a high dielectric constant, and a ferroelectric layer 70 are formed on a clean and smooth surface of the Si substrate 17. The ferroelectric layer 70 may be made of $PbLaTiO_x$ (i.e., so-called PLT) or $PbzrTiO_x$ (i.e., so-called PZT), for example, but may be any other ferroelectric film with crystallinity. In the structure shown in FIG. 13(a), the MgO layer 61 with excellent crystallinity is formed as a buffer layer for the ferroelectric layer 70 by the method disclosed in the fifth embodiment. Accordingly, the ferroelectric layer 70 also exhibits excellent crystallinity or good orientations. However, the ferroelectric layer 70 made of PLT or PZT does not always have the same crystal structure as the MgO layer 61, and has a different lattice constant from that of the MgO layer 61. Thus, the atoms of the ferroelectric and MgO layers 70 and 61 do not form perfect bonds in the interface therebetween as in the eighth embodiment. That is to say, the ferroelectric layer 70 does not always have a single crystal structure over a broad range. But the ferroelectric layer 70 shows good orientations by being affected by the crystal structure of the MgO layer 61. Specifically, particular crystal axes (e.g., c-axis) thereof are oriented vertically to the surface of the substrate over the entire ferroelectric layer 70. The ferroelectric layer 70 is in a polycrystalline state, in which several domains separately exist with the directions of crystal axes slightly deviated from each other. However, if the direction in which particularly high ferroelectricity is exhibited (i.e., the direction in which residual polarization is attained) is vertical to the surface of the substrate or aligned in a direction defined by a certain angle, then the ferroelectric layer 70 ensures high residual polarization or can exhibit uniform ferroelectric properties.

On the other hand, FIG. 13(b) illustrates a structure in which an Mg layer 60 is interposed between the MgO layer 61 and the Si substrate 17. A structure like this is formed by controlling the $O_2$ molecules 64 supplied to such an amount that the Mg layer 60 is not oxidized entirely. Even so, or if a device like a semiconductor memory is formed using this substrate, the electrical and mechanical characteristics of the device are not adversely affected by the Mg layer 60.

According to the ninth embodiment, the MgO layer may be formed by modifying the method of the fifth embodiment. Specifically, only the Mg layer 60 is formed without forming the Ce layer 32 in the process step shown in FIG. 9(a) and then $O_2$ molecules 64 may be supplied as shown in FIG. 9(b). Alternatively, the MgO layer may also be formed by oxidizing the Mg layer with oxygen needed in forming the ferroelectric layer 70 as will be described for the tenth embodiment.

Also, according to this embodiment, the ferroelectric film may be formed by the well-known technique of forming a ferroelectric film using the MBE process. Thus, the description of the forming method will be omitted herein.

In the structure including the ferroelectric layer 70 according to this embodiment, the ferroelectric layer 70 is formed on the MgO layer 61, which functions as a buffer layer with a dielectric constant as high as about 9.7. Accordingly, even if the buffer layer is thick, a required dielectric constant can be maintained. That is to say, the generation of leakage current, which usually results from a thin buffer layer, for example, can be suppressed effectively. In addition, the MgO layer 61 with excellent crystallinity is formed first and then the ferroelectric layer 70 is formed on that MgO layer 61 Thus, the resultant ferroelectric layer 70 shows good orientations, high residual polarization or much less varied ferroelectric properties.

In this case, almost no $SiO_2$ layer with a low dielectric constant is formed. Accordingly, where an electrode is provided over the ferroelectric layer and a voltage is applied between the electrode and the substrate, it is possible to avoid an unfavorable situation where the voltage is mostly applied to the SiO$_2$ layer with a low dielectric constant and just a fraction of the voltage is actually applied to the ferroelectric layer.

Embodiment 10

Next, a tenth embodiment of the present invention will be described. In this and the next embodiments, a structure, in which a dielectric layer with a high dielectric constant and a ferroelectric layer are formed in this order on an SiO$_2$ layer, will be described by way of example.

As in the fifth embodiment, the fabrication system shown in FIG. 8 is used according to this embodiment, too. Also, in this embodiment, Knudsen cells (K-cells) may be used as units for supplying metal Ce and metal materials for the ferroelectric film instead of the EB evaporation units 57a and 57b shown in FIG. 8 as mentioned for the fifth embodiment. In any case, the EB evaporation units 57b or Knudsen cells for forming the ferroelectric film should be provided for the same number of types of metal materials for forming the ferroelectric film.

According to this embodiment, the Si substrate is also prepared prior to the MBE growth as already described for the fifth embodiment.

FIGS. 14(a) through 14(d) illustrate a process of forming a ZrO$_2$ layer and a ferroelectric layer on an SiO$_2$ layer according to the tenth embodiment.

Figure 14A:
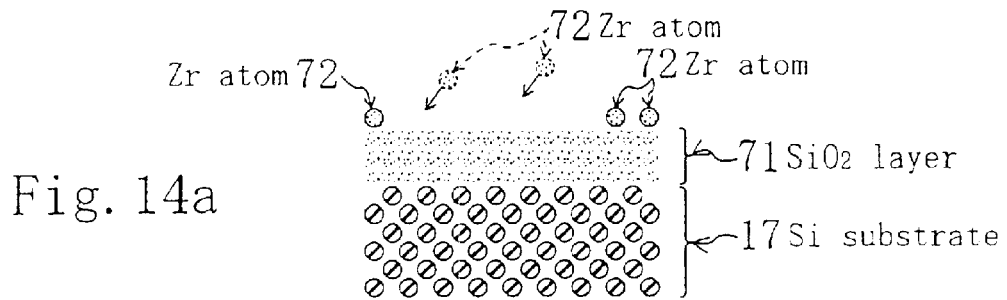
FIGS. 14(a) through 14(d) illustrate a process of forming a $ZrO_2$ layer and a ferroelectric layer on an $SiO_2$ layer according to the tenth embodiment.

First, before the process step shown in FIG. 14(a) is started, an SiO$_2$ layer 71 of amorphous silicon dioxide is formed by a thermal oxidation technique on a clean and smooth surface of the Si substrate 17. The thickness of the SiO$_2$ layer 71 may be selected depending on the characteristics required for an intended device, and is usually between 0.5 and 20 nm. The surface of the Si substrate 17 is preferably a (001) plane, but may be a (111) plane or any other plane with a higher-order index or an off-axis plane tilted from any of these planes by several degrees. Thereafter, the substrate is loaded into an ultrahigh vacuum chamber and heated up to a temperature between 100 and 400° C., thereby removing water or gases remaining on the surface of the SiO$_2$ layer 71.

Next, as shown in FIG. 14(a), Zr atoms 72 are supplied onto the SiO$_2$ layer 71. Then, those Zr atoms 72, which have reached the surface of the SiO$_2$ layer 71 with an amorphous structure, diffuse along the surface of the SiO$_2$ layer 71 and disperse substantially uniformly within the plane so as to enter an equilibrium state. That is to say, a Zr layer 65 consisting of Zr atoms only is formed on the SiO$_2$ layer 71. This Zr layer 65 has an amorphous or polycrystalline structure.

Figure 14B:
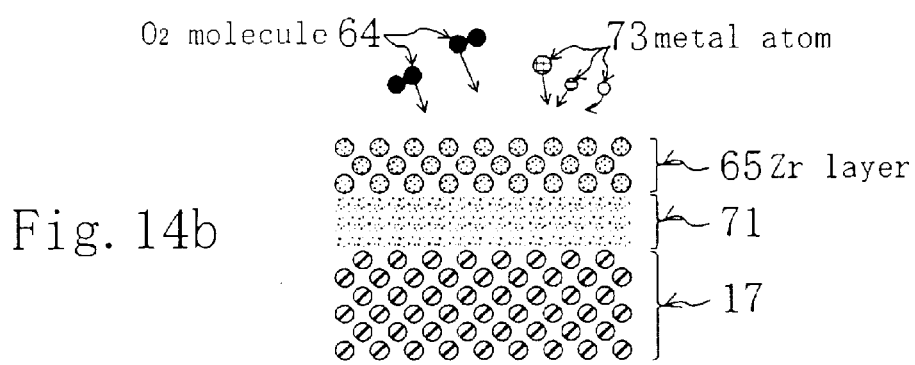

Next, as shown in FIG. 14(b), metal atoms 73 for forming a ferroelectric layer (e.g., Pb, La and Ti atoms for PLT) and O$_2$ molecules 64 are supplied onto the Zr layer 65.

Figure 14C:
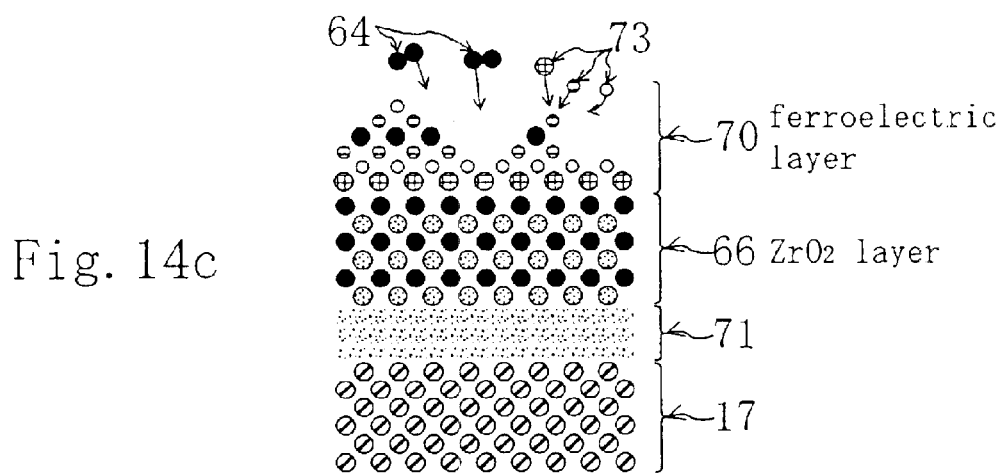

Then, the ferroelectric layer 70 is gradually formed as shown in FIG. 14(c). However, at the same time, only the O$_2$ molecules 64 diffuse inside the Zr layer 65 to crystallize the Zr layer 65 upon its solidification. As a result, a ZrO$_2$ layer 66 is formed.

Figure 14D:
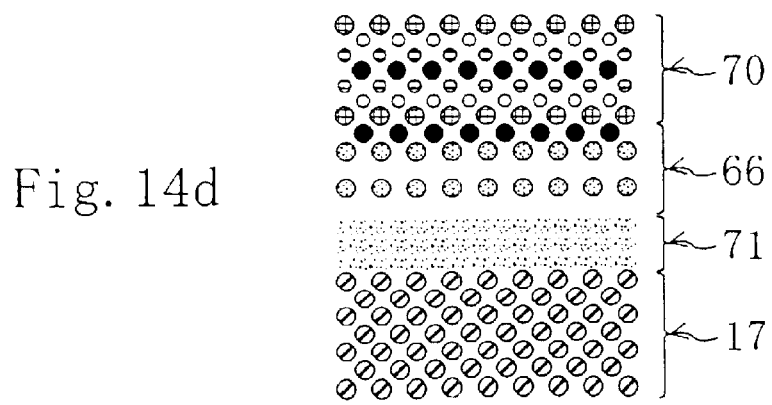

Consequently, the ferroelectric layer 70 is formed on the ZrO$_2$ layer 66 as shown in FIG. 14(d).

According to this embodiment, the ferroelectric film may be formed by the well-known technique of forming a ferroelectric film using the MBE process. Thus, the description of the forming method will be omitted herein.

In the fabricating method of this embodiment, the SiO$_2$ layer 71 with an amorphous structure is formed first, the Zr layer 65 is formed next on the SiO$_2$ layer 71 and then O$_2$ molecules (or atoms) 64 needed in forming a ferroelectric layer are diffused inside the Zr layer 65. Zr is crystallized when solidified due to oxidation, thereby forming the ZrO$_2$ layer 66. Accordingly, a ferroelectric layer 70 with good orientations can be advantageously formed without using particularly difficult techniques for fabrication.

The O$_2$ molecules 64 shown in FIG. 14(b) may be supplied at the same time with the metal atoms 73 for forming the ferroelectric layer. Alternatively, the ZrO$_2$ layer may be formed in advance by supplying the O$_2$ molecules to the Zr layer 65 and then the ferroelectric layer may be formed thereon. Also, an Si(111) substrate may be used in place of the Si(001) substrate.

Figure 15A:
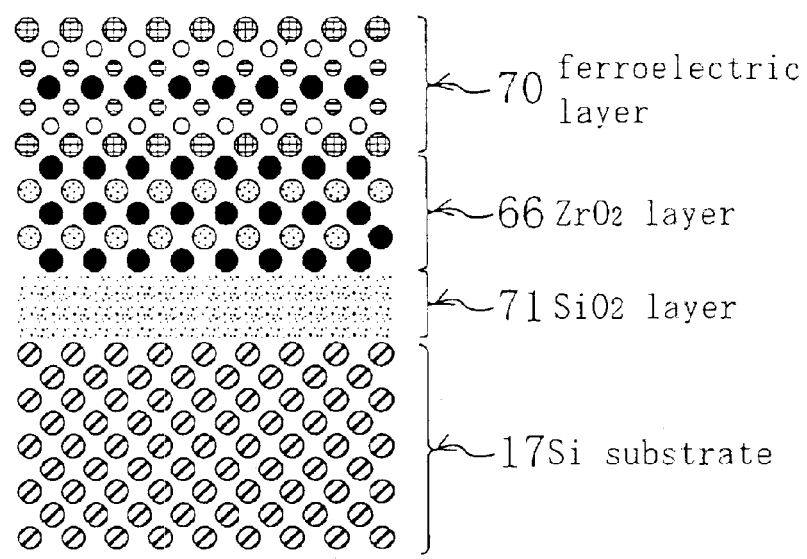
FIGS. 15(a) and 15(b) illustrate two exemplary multilayer structures (or dielectric films) each consisting of low-dielectric-constant film, high-dielectric-constant film and ferroelectric film formed by a fabrication process of the tenth embodiment.
Figure 15B:
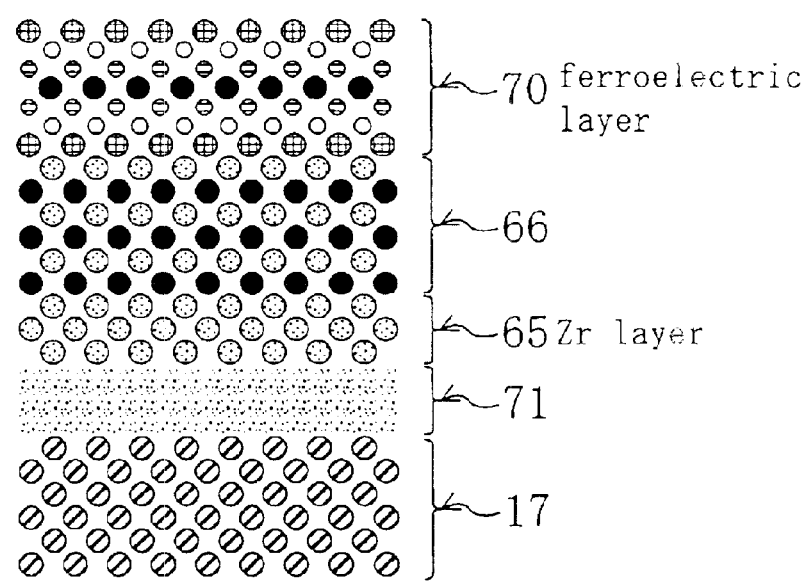

FIGS. 15(a) and 15(b) illustrate two multilayer structures (or dielectric films) each including the SiO$_2$, ZrO$_2$ and ferroelectric layers formed by the fabrication process of the tenth embodiment.

FIG. 15(a) illustrates a state where the SiO$_2$ layer 71 with an amorphous structure, ZrO$_2$ layer 66 with a crystal structure and ferroelectric layer 70 with good orientations are stacked in this order on the Si substrate 17. On the other hand, FIG. 15(b) illustrates a state where the Zr layer 65 has not been oxidized completely but part of it remains the Zr layer 65. Even in the structure shown in FIG. 15(b), the ferroelectric layer 70 can have good orientations because the ZrO$_2$ layer 66 is crystallized when solidified. Thus, the characteristics of the resulting device are not affected adversely.

Figure 16:
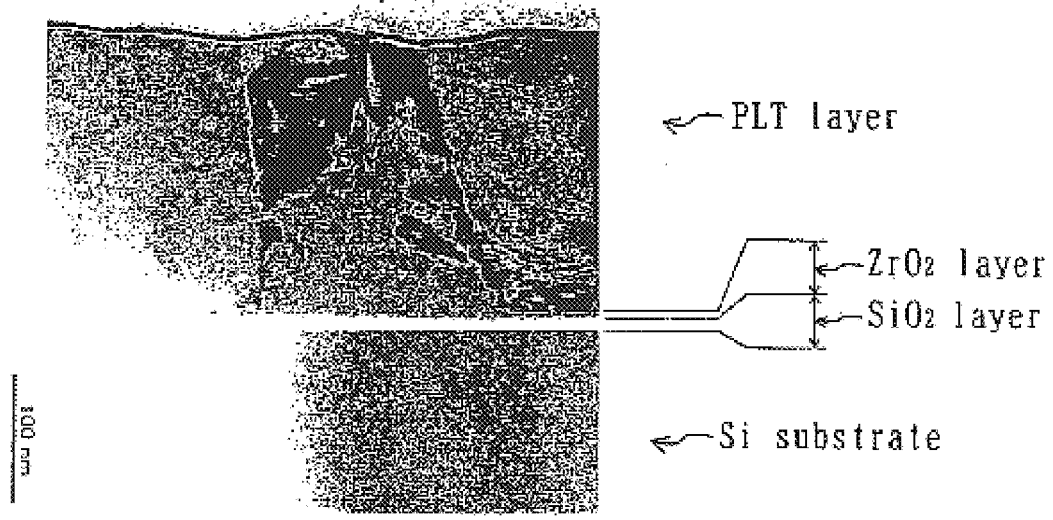
FIG. 16 is a copy of a cross-sectional TEM image obtained by imaging a cross section of the multilayer structure (dielectric film) formed by the fabrication process of the tenth embodiment using a transmission electron microscope (TEM).

FIG. 16 is a copy of a cross-sectional TEM image obtained by imaging the cross section of the multilayer structure (dielectric film) formed by the fabrication process of the tenth embodiment using a transmission electron microscope (TEM). A p-type Si substrate with a (001) plane is used as the Si substrate. The thickness of the SiO$_2$ layer is 10 nm, while the thickness of the ZrO$_2$ layer is about 9 nm. This ZrO$_2$ layer is obtained by forming a Zr layer to a thickness of 3 nm on an SiO$_2$ layer with an amorphous structure and then by solidifying and crystallizing the Zr layer with oxygen supplied in forming a ferroelectric layer. It can also be seen that a PLT layer (i.e., PbLaTiO$_x$ layer) has been formed as the ferroelectric layer on the ZrO$_2$ layer.

It should be noted that in the structure shown in FIG. 16, the interface between the Si substrate and the SiO$_2$ layer and the interface between the SiO$_2$ and ZrO$_2$ layers have both been formed distinctly and very smoothly and do not intersect with each other. Also, we confirmed based on a result of composition analysis using an electron probe microanalysis (EPMA) unit that very few atoms diffused from each layer into another layer. In addition, it was further found that good ferroelectric properties are attainable by this multilayer structure (or dielectric film).

Figure 17:
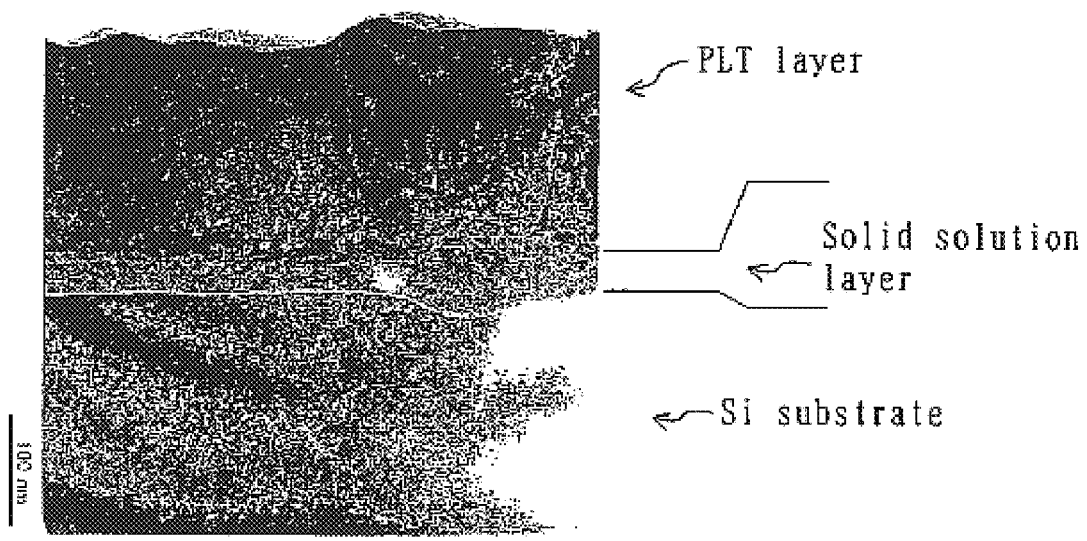
FIG. 17 illustrates a cross-sectional TEM image of a multilayer structure in which a $ZrO_2$ layer is formed on an $SiO_2$ layer by supplying Zr atoms and $O_2$ molecules thereto and then a ferroellectric layer is formed thereon.
Figure 18:
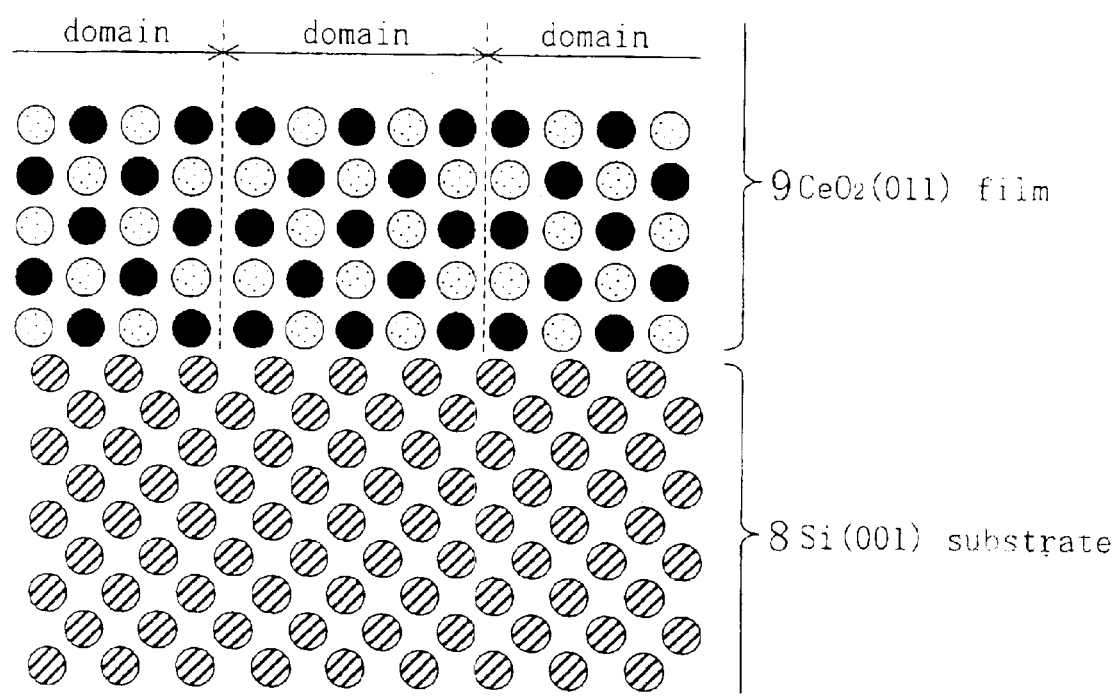
FIG. 18 is a schematic cross-sectional view illustrating a state where two types of $CeO_2$ crystal domains are formed on an Si(100) substrate.

FIG. 17 illustrates a cross-sectional TEM image of a multilayer structure (or dielectric film) formed differently from the fabrication process of the tenth embodiment. In this structure, a ZrO$_2$ layer is formed on an SiO$_2$ layer by directly supplying Zr atoms and O$_2$ molecules thereto instead of forming the Zr layer 65 shown in FIG. 14(b) and then metal atoms for a ferroelectric layer and O$_2$ molecules are supplied thereto.

It should be noted that in the structure shown in FIG. 17, no distinctly separated SiO$_2$ and ZrO$_2$ layers are observed between the Si substrate and the PLT layer as a ferroelectric layer but instead a solid solution layer is observed over a broad range therebetween.

That is to say, the Zr/SiO$_2$/Si multilayer structure is formed first according to the tenth embodiment, whereas a ZrO$_2$/SiO$_2$/Si multilayer structure is formed first and then metal atoms for the ferroelectric layer and O$_2$ molecules are supplied in the multilayer structure (dielectric film) shown in FIG. 17. As a result, the SiO$_2$ layer with an amorphous structure, which was formed first, disappears and interdiffusion is caused among Si, Zr, O and metal atoms for the ferroelectric layer (i.e., Pb, La and Ti) to form a solid solution layer. In addition, the interface between the solid solution layer and the Si substrate and the interface between the solid solution and PLT layers intersect with each other. Thus, the locations of these interfaces are indefinite. It is also observed that the interfaces themselves are not flat but curved widely. Furthermore, it was also found as a result of the EPMA analysis that Pb and Zr had diffused into the Si substrate. Accordingly, the structure in such a state is too defective to be applicable to an electronic device. Moreover, it was also found that sufficiently high ferroelectric properties are not attainable by this structure, either.

That is to say, it can be seen that a ZrO$_2$ layer with a high dielectric constant and an SiO$_2$ layer showing high affinity for the Si substrate can be easily formed as a buffer layer for a ferroelectric layer in accordance with the fabrication process of the tenth embodiment. If such a thermal oxide film is formed on an Si substrate by thermally oxidizing the Si substrate, the number of interface states or defects existing within the Si substrate is much smaller compared to forming a CeO$_2$, ZrO$_2$ or MgO layer on the Si substrate. Thus, the electrical characteristics of a resultant semiconductor device including this semiconductor layer and various dielectric films formed thereon will be excellent. Although the SiO$_2$ layer with a low dielectric constant (about 3.9) exists, the SiO$_2$ layer is very thin and the decrease in residual polarization can be suppressed in the device as a whole. And it was found that a device like an FeRAM with high residual polarization can be formed.

Also, since the ZrO$_2$ layer with a high dielectric constant (about 12.5) is included, even a thick buffer layer can still attain a high dielectric constant as a whole. Consequently, a ferroelectric memory, including a buffer layer with small leakage current and high breakdown strength, can be obtained.

In the eighth and ninth embodiments, a multilayer structure, including the MgO, Bi$_2$O$_3$, ZrO$_2$Y$_2$O$_3$ or La$_2$O$_3$ layer formed in accordance with any of the fifth through seventh embodiments and a CeO$_2$ layer, may be used as a buffer layer.

What is claimed is:

1. A dielectric film comprising:

an underlying layer formed on a crystalline semiconductor layer and made of a crystalline metal oxide that substantially lattice-matches crystals of the semiconductor on the principal surface of the semiconductor layer; and a crystalline CeO$_2$ layer formed on the underlying layer, wherein the crystalline semiconductor layer is an Si layer, a principal surface of the Si layer is a (001) plane, and a film surface of the crystalline CeO$_2$ layer is a (001) plane.

2. The dielectric film of claim 1, wherein the metal material for the crystalline metal oxide is at least one material selected from the group consisting of Mg, Zr, Y, Ce, La and Bi.

3. The dielectric film of claim 1, wherein a ferroelectric layer is formed on the crystalline CeO$_2$ layer.

* * * * *